(12) United States Patent
Ting et al.

(10) Patent No.: US 10,050,183 B2
(45) Date of Patent: Aug. 14, 2018

(54) LIGHT EMITTING DEVICE

(71) Applicant: Genesis Photonics Inc., Tainan (TW)

(72) Inventors: Shao-Ying Ting, Tainan (TW); Kuan-Chieh Huang, Tainan (TW); Jing-En Huang, Tainan (TW); Yu-Feng Lin, Tainan (TW); Yi-Ru Huang, Chiayi (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/405,323

(22) Filed: Jan. 13, 2017

(65) Prior Publication Data

US 2017/0125645 A1 May 4, 2017

Related U.S. Application Data

(63) Continuation of application No. 14/705,977, filed on May 7, 2015, now abandoned.

(30) Foreign Application Priority Data

| May 7, 2014 | (TW) | ............................... 103116262 A |
| May 14, 2014 | (TW) | ............................... 103116987 A |
| Apr. 27, 2015 | (TW) | ............................... 104113482 A |

(51) Int. Cl.
*H01L 33/48* (2010.01)
*H01L 33/38* (2010.01)
(Continued)

(52) U.S. Cl.
CPC ............ *H01L 33/486* (2013.01); *H01L 33/38* (2013.01); *H01L 33/40* (2013.01); *H01L 33/46* (2013.01);
(Continued)

(58) Field of Classification Search
CPC .................................................. H01L 33/486
See application file for complete search history.

(56) References Cited

U.S. PATENT DOCUMENTS

| 8,659,043 B1 | 2/2014 | Tischler et al. |
| 2006/0006404 A1 | 1/2006 | Ibbetson et al. |

(Continued)

FOREIGN PATENT DOCUMENTS

| CN | 1521816 | 8/2004 |
| CN | 101740707 | 6/2010 |

(Continued)

OTHER PUBLICATIONS

"Office Action of Taiwan Related Application, Application No. 105104633", dated Oct. 27, 2016, p. 1-p. 6, in which the listed references were cited.

(Continued)

*Primary Examiner* — Khaja Ahmad
(74) *Attorney, Agent, or Firm* — JCIPRNET

(57) ABSTRACT

A light emitting device includes a light emitting unit, a light transmissive layer and an encapsulant. The light emitting unit includes a substrate, an epitaxial structure layer disposed on the substrate, and a first electrode and a second electrode disposed on the same side of the epitaxial structure layer, respectively. The light emitting unit is disposed on the light transmissive layer and at least a part of the first electrode and a part of the second electrode are exposed by the light transmissive layer. The encapsulant encapsulates the light emitting unit and at least exposes a part of the first electrode and a part of the second electrode. Each of the first electrode and the second electrode extends outward from the epitaxial structure layer, and covers at least a part of an upper surface of the encapsulant, respectively.

14 Claims, 19 Drawing Sheets

(51) Int. Cl.
*H01L 33/40* (2010.01)
*H01L 33/46* (2010.01)
*H01L 33/50* (2010.01)
*H01L 33/54* (2010.01)
*H01L 33/62* (2010.01)

(52) U.S. Cl.
CPC ............ *H01L 33/502* (2013.01); *H01L 33/54* (2013.01); *H01L 33/62* (2013.01)

(56) References Cited

U.S. PATENT DOCUMENTS

| | | | |
|---|---|---|---|
| 2006/0113555 | A1* | 6/2006 | Yang .................. H01L 33/62 257/99 |
| 2006/0192223 | A1* | 8/2006 | Lee .................. H01L 33/38 257/99 |
| 2008/0128735 | A1 | 6/2008 | Yoo et al. |
| 2008/0191236 | A1 | 8/2008 | De Graaf et al. |
| 2008/0284315 | A1* | 11/2008 | Tasumi .............. G02B 6/0083 313/503 |
| 2008/0290353 | A1 | 11/2008 | Medendorp, Jr. et al. |
| 2009/0160043 | A1 | 6/2009 | Shen et al. |
| 2009/0316384 | A1 | 12/2009 | Kanayama et al. |
| 2010/0148198 | A1 | 6/2010 | Sugizaki et al. |
| 2010/0258830 | A1* | 10/2010 | Ide .................. H01L 33/60 257/98 |
| 2010/0259920 | A1 | 10/2010 | Lin |
| 2011/0001148 | A1 | 1/2011 | Sun et al. |
| 2011/0057205 | A1 | 3/2011 | Mueller et al. |
| 2011/0215360 | A1* | 9/2011 | Wang .................. H01L 33/62 257/99 |
| 2011/0254040 | A1 | 10/2011 | Nagai |
| 2011/0260184 | A1 | 10/2011 | Furuyama |
| 2011/0278631 | A1* | 11/2011 | Shen .................. H01L 33/38 257/99 |
| 2011/0291135 | A1 | 12/2011 | Hsieh et al. |
| 2011/0316025 | A1 | 12/2011 | Kuzuhara et al. |
| 2012/0112220 | A1 | 5/2012 | West et al. |
| 2012/0242216 | A1 | 9/2012 | Kotani et al. |
| 2012/0248484 | A1 | 10/2012 | Sato et al. |
| 2013/0119424 | A1 | 5/2013 | Kang et al. |
| 2013/0194794 | A1 | 8/2013 | Kim |
| 2014/0048825 | A1 | 2/2014 | Hsieh et al. |
| 2014/0203308 | A1 | 7/2014 | Tischler |
| 2014/0231844 | A1 | 8/2014 | Akimoto et al. |
| 2014/0231848 | A1 | 8/2014 | Tischler et al. |
| 2015/0333227 | A1 | 11/2015 | Lee et al. |
| 2016/0005939 | A1 | 1/2016 | Andrews |
| 2016/0013384 | A1 | 1/2016 | Ting et al. |
| 2016/0086929 | A1 | 3/2016 | Ting et al. |
| 2016/0093766 | A1 | 3/2016 | Ting et al. |
| 2016/0254428 | A1 | 9/2016 | Ting et al. |
| 2016/0293809 | A1 | 10/2016 | Huang et al. |
| 2017/0005236 | A1 | 1/2017 | Huang et al. |
| 2017/0084800 | A1 | 3/2017 | Hung et al. |

FOREIGN PATENT DOCUMENTS

| | | |
|---|---|---|
| CN | 101878540 | 11/2010 |
| CN | 101958391 | 1/2011 |
| CN | 102270730 | 12/2011 |
| CN | 102299232 | 12/2011 |
| CN | 102299246 | 12/2011 |
| CN | 102347427 | 2/2012 |
| CN | 102870242 | 1/2013 |
| CN | 102918662 | 2/2013 |
| CN | 103325776 | 9/2013 |
| CN | 103325916 | 9/2013 |
| CN | 103400921 | 11/2013 |
| CN | 103474550 | 12/2013 |
| TW | 200929389 | 7/2009 |
| TW | 201003890 | 1/2010 |
| TW | 201006000 | 2/2010 |
| TW | 201244178 | 11/2012 |
| TW | 201324736 | 6/2013 |
| TW | 201336024 | 9/2013 |
| TW | 201407749 | 2/2014 |

OTHER PUBLICATIONS

"Office Action of related U.S. Appl. No. 14/957,630," dated Dec. 21, 2016, p. 1-p. 9, in which the listed U.S. application (No. 1-2) references were cited.
"Office Action of related U.S. Appl. No. 14/957,631", dated Dec. 22, 2016, p. 1-p. 12.
"Office Action of China Related Application, application No. 201410669621.9", dated Jan. 3, 2017, p. 1-p. 8, in which the listed references were cited.
"Office Action of related U.S. Appl. No. 15/175,019", dated Mar. 7, 2017, p. 1-p. 13, in which the listed U.S. reference was cited.
"Office Action of China Related Application, application No. 201410530705.4", dated Apr. 27, 2017, p. 1-p. 7, in which the listed China references were cited.
"Office Action of Taiwan Related Application, Application No. 103135425", dated Sep. 10, 2016, p. 1-p. 6, in which the listed references were cited.
Office Action of related U.S. Appl. No. 15/046,407 dated Sep. 2, 2016, p. 1-p. 10.
"Office Action of related U.S. Appl. No. 14/513,215", dated Feb. 5, 2016, p.1-p.16, in which the listed U.S. application (No. 1-4) references were cited.
"Office Action of China Related Application, application No. 201410530705.4", dated Oct. 9, 2016, p. 1-p. 7, in which the listed Foreign patent references were cited.
"Office Action of related U.S. Appl. No. 15/175,019", dated Sep. 28, 2017, p. 1-p. 22, in which the listed references (U.S. Appl. No. 1-4) were cited.
"Office Action of Taiwan Related Application, application No. 103124160", dated Dec. 13, 2017, p. 1-p. 4, in which the listed references were cited.
"Office Action of related U.S. Appl. No. 15/268,652", dated Sep. 8, 2017, p. 1-p. 21, in which the listed reference were cited.
"Office Action of related U.S. Appl. No. 14/957,631", dated Aug. 22, 2017, p. 1-p. 24.
"Office Action of China Related Application, application No. 201410359002.X", dated Jul. 27 2017, p. 1-p. 7, in which the listed references were cited.
"Office Action of China Related Application, application No. 201410357440.2", dated Jun. 23, 2017, p. 1-p. 9, in which the listed references were cited.
"Office Action of China Related Application, application No. 201410357440.2", dated Apr. 10, 2018, pp. 1-9.

* cited by examiner

LIGHT EMITTING DEVICE

CROSS-REFERENCE TO RELATED APPLICATION

This application is a continuation application of and claims the priority benefit of U.S. prior application Ser. No. 14/705,977, filed on May 7, 2015, now pending, which claims the priority benefit of Taiwan application serial no. 103116262, filed on May 7, 2014, Taiwan application serial no. 104113482, filed on Apr. 27, 2015, and Taiwan application serial no. 103116987, filed on May 14, 2014. The entirety of each of the above-mentioned patent applications is hereby incorporated by reference herein and made a part of this specification.

BACKGROUND OF THE INVENTION

Field of the Invention

The invention relates to a light emitting device, and particularly relates to a light emitting diode (LED) package structure.

Description of Related Art

In a conventional flip-chip LED package structure, an edge of an epitaxial structure layer is aligned with or contracted inward relative to an edge of a substrate, and edges of an N electrode and a P electrode are aligned with the edge of the epitaxial structure layer or is spaced by a vertical distance with the edge of the epitaxial structure layer. Namely, an orthogonal projection area of the N electrode and the P electrode on the substrate is smaller than an orthogonal projection area of the epitaxial structure layer on the substrate. In case of such configuration, when the flip-chip LED package is to be assembled to an external circuit, since an electrode area of the N electrode and the P electrode is relative small, the LED package may have problems of inaccurate alignment and poor electrode contact in assembling.

SUMMARY OF THE INVENTION

The invention is directed to a light emitting device having a larger electrode area, which avails improving an alignment accuracy in follow-up assembling.

The invention provides a light emitting device including a light emitting unit, a light transmissive layer and an encapsulant. The light emitting unit includes a substrate, an epitaxial structure layer disposed on the substrate, and a first electrode and a second electrode respectively disposed on a same side of the epitaxial structure layer. The light emitting unit is disposed on the light transmissive layer and the light transmissive layer at least exposes the first electrode and the second electrode. The encapsulant encapsulates the light emitting unit and at least exposes a part of the first electrode and a part of the second electrode. The first electrode and the second electrode respectively extend outward from the epitaxial structure layer, and respectively cover at least a part of an upper surface of the encapsulant.

In an embodiment of the invention, the first electrode includes a first electrode portion connected to the epitaxial structure layer and a first electrode extending portion connected to the first electrode portion, and the second electrode includes a second electrode portion connected to the epitaxial structure layer and a second electrode extending portion connected to the second electrode portion, and the first electrode extending portion and the second electrode extending portion respectively extend outward to at least a part of the upper surface of the encapsulant.

In an embodiment of the invention, the first electrode extending portion and the second electrode extending portion are aligned with or contracted inward relative to an edge of the upper surface of the encapsulant.

In an embodiment of the invention, the first electrode portion and the second electrode portion are aligned with or contracted inward relative to an edge of the epitaxial structure layer.

In an embodiment of the invention, the light emitting device further includes one or a plurality of flat surfaces, and each of the flat surfaces includes the light transmissive layer and the encapsulant.

In an embodiment of the invention, the first electrode extending portion includes a plurality of first grating type electrodes, and the second electrode extending portion includes a plurality of second grating type electrodes, the first grating type electrodes are distributed on the first electrode portion and a part of the upper surface of the encapsulant, and the second grating type electrodes are distributed on the second electrode portion and a part of the upper surface of the encapsulant.

In an embodiment of the invention, at least a part of the first electrode extending portion extends from an edge of the first electrode portion towards a direction away from the second electrode portion, and at least a part of the second electrode extending portion extends from an edge of the second electrode portion towards a direction away from the first electrode portion.

In an embodiment of the invention, the first electrode extending portion and the second electrode extending portion respectively include a plurality of sub-electrodes separated from each other.

In an embodiment of the invention, the sub-electrodes of the first electrode extending portion are located in at least one corner away from the second electrode on the upper surface of the encapsulant, and the sub-electrodes of the second electrode extending portion are located in at least one corner away from the first electrode on the upper surface of the encapsulant.

In an embodiment of the invention, top surfaces of the first electrode extending portion and the second electrode extending portion are substantially coplanar with the upper surface of the encapsulant.

In an embodiment of the invention, the first electrode portion and the first electrode extending portion are seamlessly connected, and the second electrode portion and the second electrode extending portion are seamlessly connected.

In an embodiment of the invention, the first electrode extending portion and the second electrode extending portion respectively include an adhesion layer and a barrier layer disposed between the adhesion layer and the encapsulant.

In an embodiment of the invention, a material of the adhesion layer includes gold, tin, aluminium, silver, copper, indium, bismuth, platinum, gold-tin alloy, tin-silver alloy, tin-silver-copper alloy (Sn—Ag—Cu (SAC) alloy) or a combination thereof, and a material of the barrier layer includes nickel, titanium, tungsten, gold or an alloy of a combination thereof.

In an embodiment of the invention, the first electrode and the second electrode respectively include a reflection layer respectively disposed between the electrode extending portions and the encapsulant.

In an embodiment of the invention, a material of the reflection layer includes gold, aluminium, silver, nickel, titanium, or an alloy of a combination thereof In an embodiment of the invention, the light emitting device further includes a reflection layer, disposed on the upper surface of the encapsulant.

In an embodiment of the invention, at least a part of the reflection layer is located between the electrodes and the encapsulant.

In an embodiment of the invention, a material of the reflection layer includes gold, aluminium, silver, nickel, titanium, distributed Bragg reflector (DBR), a resin layer doped with reflection particles with high reflectivity or a combination thereof In an embodiment of the invention, the light emitting device further includes a wavelength conversion material wrapping the light emitting unit and at least exposing a part of the first electrode and a part of the second electrode.

In an embodiment of the invention, the wavelength conversion material includes a fluorescent material or a quantum dot material.

In an embodiment of the invention, the wavelength conversion material is formed on a surface of the light emitting unit, foamed on a surface of the encapsulant or mixed in the encapsulant.

In an embodiment of the invention, the first sub-electrodes and the second sub-electrodes are laminar electrodes, spherical electrodes, or grating type electrodes.

An embodiment of the invention provides a light emitting device including a light emitting unit, a light transmissive layer and an encapsulant. The light emitting unit includes a substrate, an epitaxial structure layer disposed on the substrate, and a first electrode and a second electrode respectively disposed on a same side of the epitaxial structure layer opposite to the substrate. The light transmissive layer is disposed on the light emitting unit and is located at one side of the substrate opposite to the epitaxial structure layer, the first electrode and the second electrode. The encapsulant is located between the light emitting unit and the light transmissive layer. The encapsulant encapsulates the light emitting unit and at least exposes a part of the first electrode and a part of the second electrode. The first electrode and the second electrode respectively extend outward from the epitaxial structure layer, and respectively cover at least a part of an upper surface of the encapsulant.

An embodiment of the invention provides a light emitting device including a light emitting unit and an encapsulant. The light emitting unit includes a substrate, an epitaxial structure layer disposed on the substrate, and a first electrode and a second electrode respectively disposed on a same side of the epitaxial structure layer. The encapsulant encapsulates the light emitting unit and at least exposes a part of the first electrode and a part of the second electrode. The first electrode and the second electrode respectively extend upward from the epitaxial structure layer without covering an upper surface of the encapsulant.

An embodiment of the invention provides a light emitting device including a light emitting unit and an encapsulant. The light emitting unit includes a substrate, an epitaxial structure layer disposed on the substrate, and a first electrode and a second electrode respectively disposed on a same side of the epitaxial structure layer. The encapsulant encapsulates the light emitting unit and at least exposes a part of the first electrode and a part of the second electrode. The first electrode and the second electrode respectively extend outward from the epitaxial structure layer and respectively cover at least a part of an upper surface of the encapsulant.

An embodiment of the invention provides a light emitting device including a light emitting unit, a light transmissive layer and an encapsulant. The light emitting unit includes a substrate, an epitaxial structure layer disposed on the substrate, and a first electrode and a second electrode respectively disposed on a same side of the epitaxial structure layer. The light emitting unit is disposed on the light transmissive layer and at least exposes the first electrode and the second electrode. The encapsulant encapsulates the light emitting unit and at least exposes a part of the first electrode and a part of the second electrode. The first electrode and the second electrode respectively extend upward from the epitaxial structure layer without covering an upper surface of the encapsulant.

An embodiment of the invention provides a light emitting device including a light emitting unit, a light transmissive layer and an encapsulant. The light emitting unit includes a substrate, an epitaxial structure layer disposed on the substrate, and a first electrode and a second electrode respectively disposed on a same side of the epitaxial structure layer opposite to the substrate. The light transmissive layer is disposed on the light emitting unit and is located at one side of the substrate opposite to the epitaxial structure layer, the first electrode and the second electrode. The encapsulant is located between the light emitting unit and the light transmissive layer, and encapsulates the light emitting unit and at least exposes a part of the first electrode and a part of the second electrode. The first electrode and the second electrode respectively extend upward from the epitaxial structure layer without covering an upper surface of the encapsulant.

According to the above descriptions, since the first electrode and the second electrode of the light emitting unit according to an embodiment of the invention extend outward from the epitaxial structure layer, and may cover at least a part of the encapsulant, compared to the conventional design of the first electrode and the second electrode, the light emitting device (the LED package) according to the embodiment of the invention has a larger electrode area, and when the light emitting device is to be assembled to an external circuit, the alignment accuracy of assembling is effectively improved. Since the first electrode and the second electrode of the light emitting unit according to an embodiment of the invention extend upward from the epitaxial structure layer, and protrude out of the encapsulant, it avails a follow-up chip bonding process.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
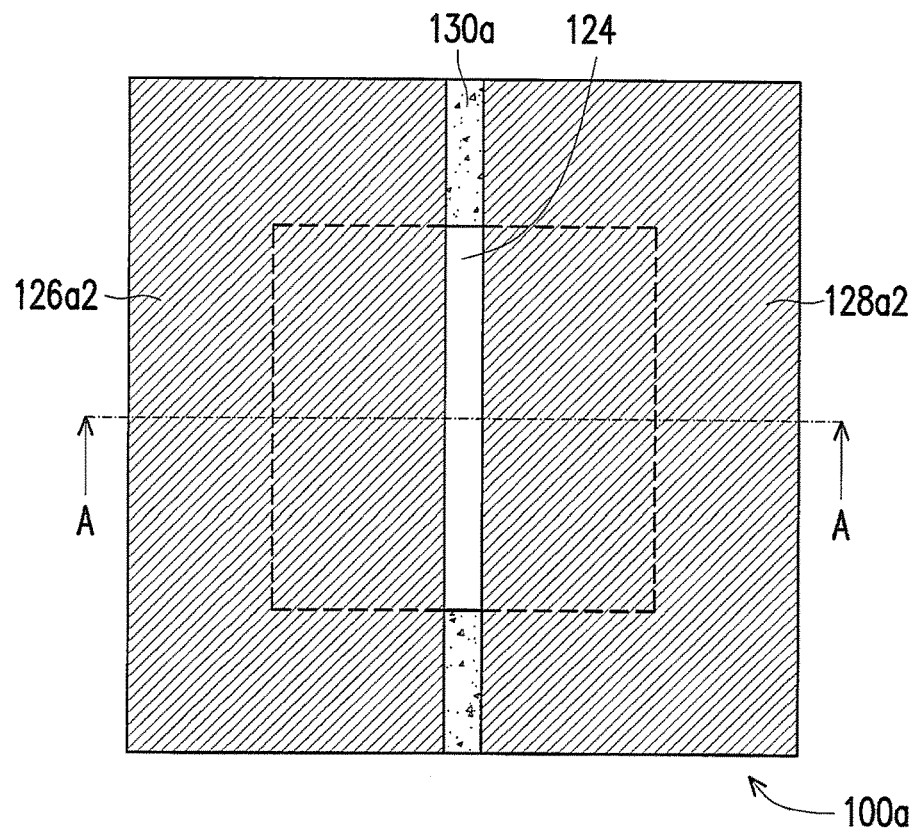
FIG. 1A is a top view of a light emitting diode (LED) package structure according to an embodiment of the invention.
Figure 1B:
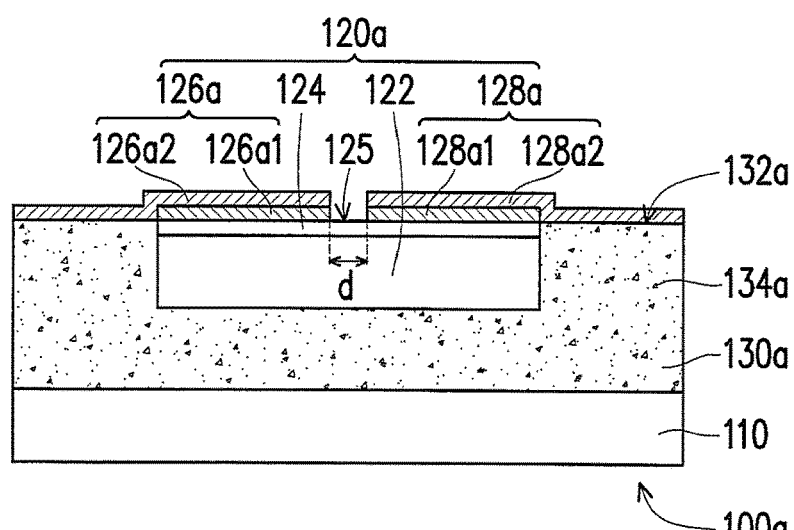
FIG. 1B is a cross-sectional view of the LED package structure of FIG. 1A viewing along a line A-A.

FIG. 1A is a top view of a light emitting device according to an embodiment of the invention. FIG. 1B is a cross-sectional view of the light emitting device of FIG. 1A viewing along a line A-A. Referring to FIG. 1 A and FIG. 1B, in the present embodiment, the light emitting device 100a includes a light transmissive layer 110, a light emitting unit 120a, and an encapsulant 130a. The light emitting unit 120a is, for example, a light emitting diode (LED), and includes a substrate 122, an epitaxial structure layer 124, a first electrode 126a and a second electrode 128a. The epitaxial structural layer 124 is disposed on the substrate 122. In the present embodiment, a periphery of the epitaxial structure layer 124 is aligned with a periphery of the substrate 122. The first electrode 126a is disposed on one side of the epitaxial structure layer 124. The second electrode 128a is disposed on the epitaxial structure layer 124, where the second electrode 128a and the first electrode 126a are located on the same side of the epitaxial structure layer 124 opposite to the substrate 122, and the first electrode 126a and the second electrode 128a have an interval d therebetween. The light emitting unit 120a is disposed on the light transmissive layer 110, and the light transmissive layer 110 is located at one side of the substrate 122 of the light emitting unit 120a that is opposite to the epitaxial structure layer 124, the first electrode 126a and the second electrode 128a, and at least exposes a part of the first electrode 126a and a part of the second electrode 128a. The encapsulant 130a is disposed on the light transmissive layer 110, and is located between the light emitting unit 120a and the light transmissive layer 110, where the encapsulant 120a encapsulates the light emitting unit 120a and exposes at least a part of the first electrode 126a and a part of the second electrode 128a, and the first electrode 126a and the second electrode 128a respectively extend outward from the epitaxial structure layer 124, and respectively cover at least a part of an upper surface 132a of the encapsulant 130a. In detail, the epitaxial structure layer 124 at least includes a first semiconductor layer (not shown), a light emitting layer (not shown) and a second semiconductor layer (not shown) electrically connected to each other in a sequence, where the first electrode 126a is electrically connected to the first semiconductor layer, and the second electrode 128a is electrically connected to the second semiconductor layer. In the present embodiment, an edge of the encapsulant 130a is aligned with an edge of the light transmissive layer 110, such that the light emitting device 100a has one or a plurality of flat surfaces.

In detail, the light transmissive layer 110 of the present embodiment is adapted to guide the light emitted by the light emitting unit 120a and is pervious to the light, where a material of the light transmissive layer 110 is, for example, a transparent inorganic material, which includes but is not limited to glass or ceramic; or a transparent organic material, which includes but is not limited to silicone, epoxy resin, or various resins, and a light transmittance of the light transmissive layer 110 is at least 50%, preferably. A pattern of the light transmissive layer 110 can be a flat light transmissive plate or a light transmissive layer with other shapes. In other embodiments of the invention, the light emitting device 100a may not include the light transmissive layer 110, and the encapsulant 130a has one or a plurality of flat surfaces. The light emitting unit 120a is, for example, a flip-chip LED chip, where a material of the substrate122 of the light emitting unit 120a is, for example, sapphire, gallium nitride, gallium oxide, silicon carbide or zinc oxide, though the invention is not limited thereto. Moreover, the first electrode 126a of the present embodiment includes a first electrode portion 126a1 and a first electrode extending portion 126a2. The second electrode 128a includes a second electrode portion 128a1 and a second electrode extending portion 128a2. Edges of the first electrode portion 126a1 and the second electrode portion 128a1 are aligned with or not aligned with (for example, contracted inward relative to) the edge of the epitaxial structure layer 124. The first electrode extending portion 126a2 is located on the first electrode portion 126a1, and extends outward to cover the upper surface 132a of the encapsulant 130a. The second electrode extending portion 128a2 is located on the second electrode portion 128a1, and extends outward to cover the upper surface 132a of the encapsulant 130a. Here, the first electrode portion 126a1 and the first electrode extending portion 126a2 may adopt the same material or different materials, and the second electrode portion 128a1 and the second electrode extending portion 128a2 may also adopt the same material or different materials, which is not limited by the invention. In the present embodiment, the first electrode extending portion 126a2 respectively extends upward from the first electrode portion 126a1 and extends along a direction away from the second electrode portion 128a1, and the second electrode extending portion 128a2 respectively extends upward from the second electrode portion 128a1 and extends along a direction away from the first electrode portion 126a1.

Moreover, a material of the encapsulant 130a is, for example, a transparent inorganic material or organic material, where the inorganic material includes but is not limited to glass or ceramic, and the organic material includes but is not limited to silicone, epoxy resin, or various resins. The light emitting device 100a further includes at least one wavelength conversion material, where the wavelength conversion material includes but is not limited to a fluorescent material or a quantum dot material. The wavelength conversion material 134a can be doped in the encapsulant 130a for changing a wavelength of the light emitted by the light emitting unit 120a. In other embodiments of the invention, a wavelength conversion material layer can be directly formed on a surface of the light emitting unit 120a, and at least a part of the first electrode 126a and a part of the second electrode 128a are exposed, and the wavelength conversion material layer is located between the encapsulant 130a and the light emitting unit 120a, and a method for forming the wavelength conversion material layer includes but is not limited to spray coating or adhering. In another embodiment of the invention, the wavelength conversion material layer can be formed on the surface of the encapsulant 130a, and at least a part of the first electrode 126a and a part of the second electrode 128a are exposed, and the encapsulant 130a is located between the wavelength conversion material layer and the light emitting unit 120a, and a method for forming the wavelength conversion material layer includes but is not limited to spray coating or adhering. Certainly, in other embodiments, the light emitting device 100a may not include the wavelength conversion material, which is still a technical scheme adopted by the invention without departing from the protection range of the invention.

In brief, since the first electrode 126a and the second electrode 128a of the present embodiment have the first electrode extending portion 126a2 and the second electrode extending portion 128a2 covering the upper surface 132a of the encapsulant 130a, compared to the conventional design of the first electrode and the second electrode, the light emitting device 100a (for example, the LED package) of the present embodiment has a larger electrode area. Moreover, when the LED package 100a is to be assembled to an external circuit (not shown), the design of the first electrode 126a and the second electrode 128a avails improving the alignment accuracy of the LED package in assembling and avoiding a conventional problem of poor electrode contact. To be specific, since the first electrode extending portion 126a2 and the second electrode extending portion 128a2 respectively enlarge the areas of the first electrode portion 126a1 and the second electrode portion 128a1, when the first electrode 126a and the second electrode 128a are respectively bonded to a circuit board through a solder paste, conductive bumps or other conductive connection material, due to overflow of the conductive connection material (for example, the solder paste), the solder paste on the first electrode 126a and the solder paste on the second electrode 128a are contacted to cause a short circuit. Therefore, by adopting the first electrode extending portion 126a2 and the second electrode extending portion 128a2 of the present embodiment, the light emitting device 100a has a larger electrode area, so that when the light emitting device 100a is bonded to the circuit board through the solder paste, the situation of short circuit caused by overflow of the solder paste is mitigated or avoided, so as to ensure bonding reliability.

It should be noticed that in the present embodiment, an edge of the first electrode extending portion 126a2 and an edge of the second electrode extending portion 128a2 are aligned with an edge of the encapsulant 130a and an edge of the light transmissive layer 110, besides that the electrode area is enlarged to increase the alignment accuracy, such design can be more simple in a manufacturing process, so as to save a manufacturing time, and a reason thereof is that the encapsulant 130a can encapsulate a plurality of the light emitting units 120a having the first electrode portion 126a1 and the second electrode portion 128a1 in one process, and after the first electrode extending portion 126a2 and the second electrode extending portion 128a2 are simultaneously plated, a cutting process is performed to form the light emitting device 100a (for example, the LED package structure).

It should be noticed that reference numbers of the components and a part of contents of the aforementioned embodiment are also used in the following embodiment, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 2A:
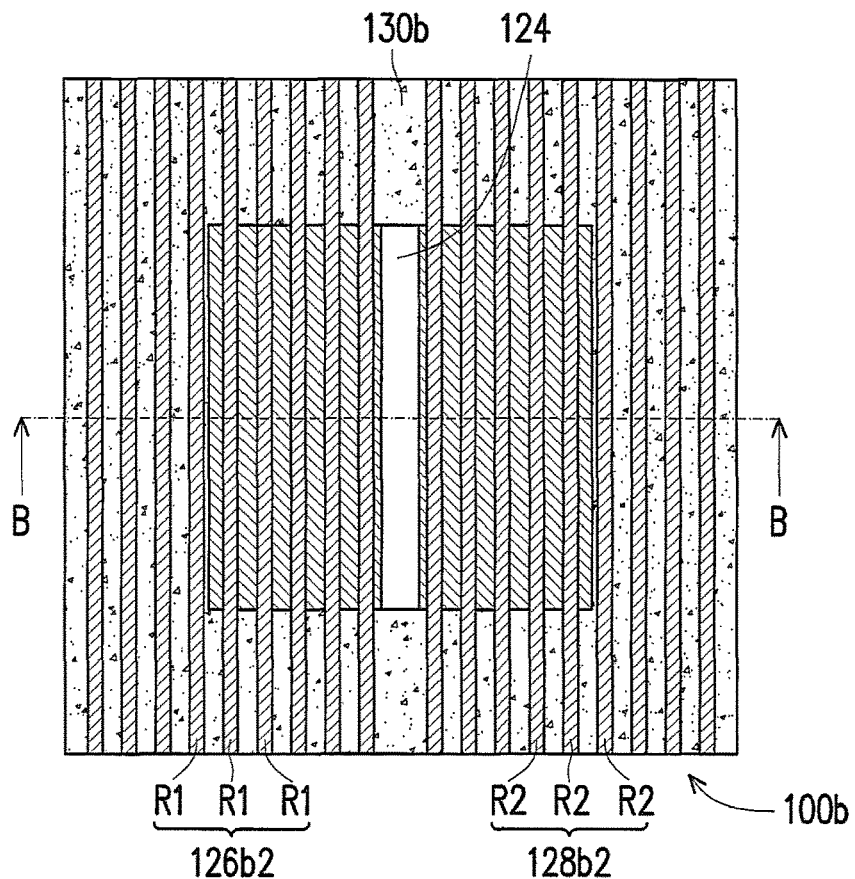
FIG. 2A is a top view of an LED package structure according to another embodiment of the invention.
Figure 2B:
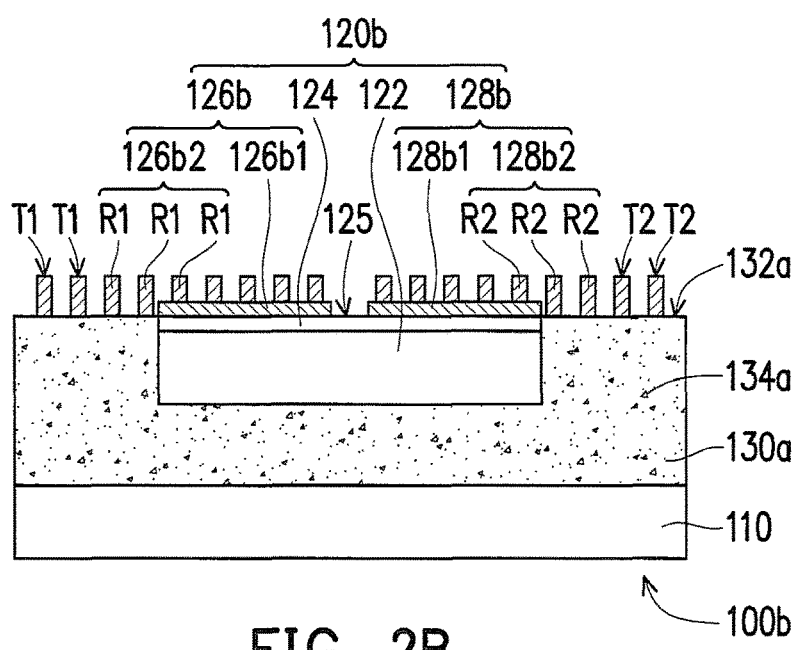
FIG. 2B is a cross-sectional view of the LED package structure of FIG. 2A viewing along a line B-B.

FIG. 2A is a top view of a light emitting device according to another embodiment of the invention. FIG. 2B is a cross-sectional view of the light emitting device of FIG. 2A viewing along a line B-B. Referring to FIG. 2A and FIG. 2B, the light emitting device 100b of the present embodiment is similar to the light emitting device 100a of FIG. 1A and FIG. 1B, and a main difference therebetween is that the first electrode extending portion 126b2 of the first electrode 126b is composed of a plurality of first grating type electrodes R1, and the second electrode extending portion 128b2 of the second electrode 128b is composed of a plurality of second grating type electrodes R2. A part of the first grating type electrodes R1 and a part of the second grating type electrodes R2 respectively extend upward from the first electrode portion 126b1 and the second electrode portion 128b1, and a part of the first grating type electrodes R1 and a part of the second grating type electrodes R2 are disposed on the upper surface 132a of the encapsulant 130a.

The first grating type electrodes R1 are arranged in intervals (for example, equally spaced) and expose a part of the first electrode portion 126b1 and a part of the encapsulant 130a. The second grating type electrodes R2 are arranged in intervals (for example, equally spaced) and expose a part of the second electrode portion 128b1 and a part of the encapsulant 130a. Particularly, each of the first grating type electrodes R1 has a first top surface T1, and each of the second grating type electrodes R2 has a second top surface T2. The first top surfaces T1 of the first gating type electrodes R1 and the second top surfaces T2 of the second grating type electrodes R2 are substantially coplanar. In this way, when the light emitting device 100b is subsequently assembled to an external circuit (not shown), the design of the first electrode 126a and the second electrode 128b of the light emitting unit 120b can provide a good assembling flatness and a larger electrode area to facilitate subsequent assembling of the LED package structure 100b.

Figure 3A:
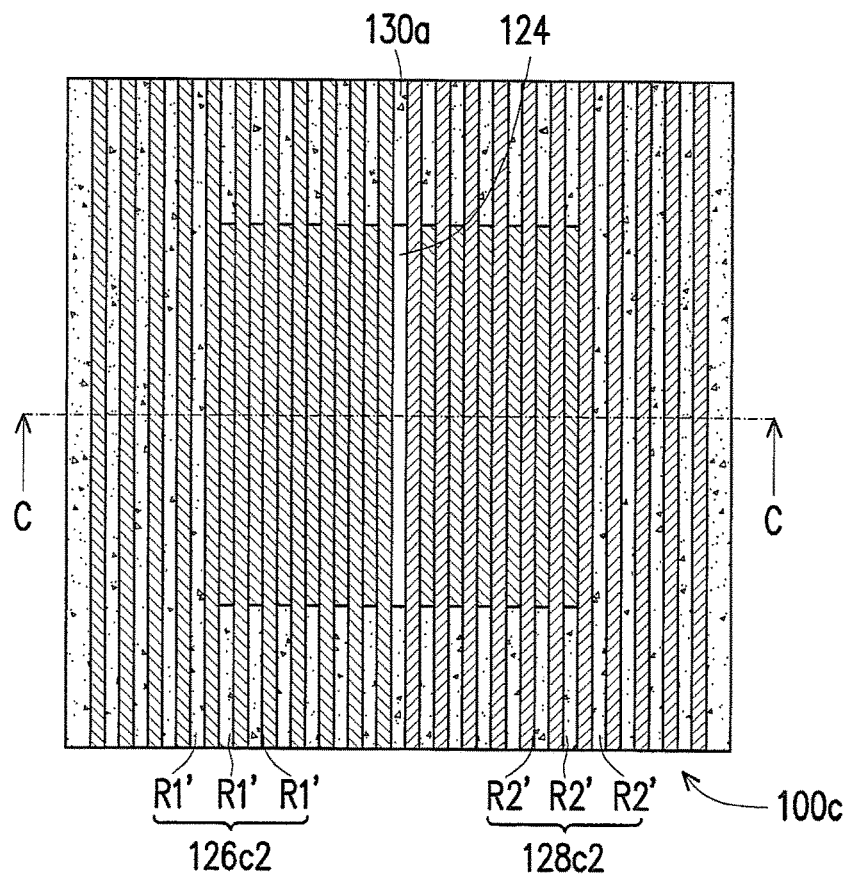
FIG. 3A is a top view of an LED package structure according to another embodiment of the invention.
Figure 3B:
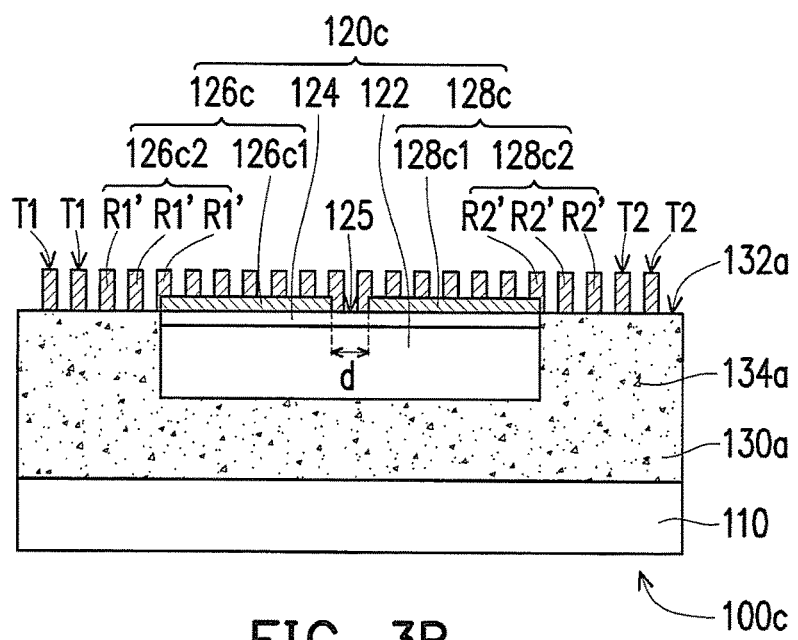
FIG. 3B is a cross-sectional view of the LED package structure of FIG. 3A viewing along a line C-C.

FIG. 3A is a top view of a light emitting device according to another embodiment of the invention. FIG. 3B is a cross-sectional view of the light emitting device of FIG. 3A viewing along a line C-C. Referring to FIG. 3A and FIG. 3B, the light emitting device 100c of the present embodiment is similar to the light emitting device 100b of FIG. 2A and FIG. 2B, and a main difference therebetween is that the first electrode extending portion 126c2 of the present embodiment is composed of a plurality of first grating type electrodes RV, and the second electrode extending portion 128c2 is composed of a plurality of second grating type electrodes R2', where the first grating type electrodes R1' and the second grating type electrodes R2' are further disposed at the interval d between the first electrode 126c and the second electrode 128c. In this way, the electrode area of the light emitting unit 120c can extend to the encapsulant 130a from the epitaxial structure layer 124, such that the light emitting device 100c has a larger electrode area to achieve a simple manufacturing process, and avail improving the alignment accuracy of subsequent assembling process. It should be noticed that the connection between the grating type electrodes and the circuit board can be implemented through an anisotropic conductive adhesive.

Figure 4A:
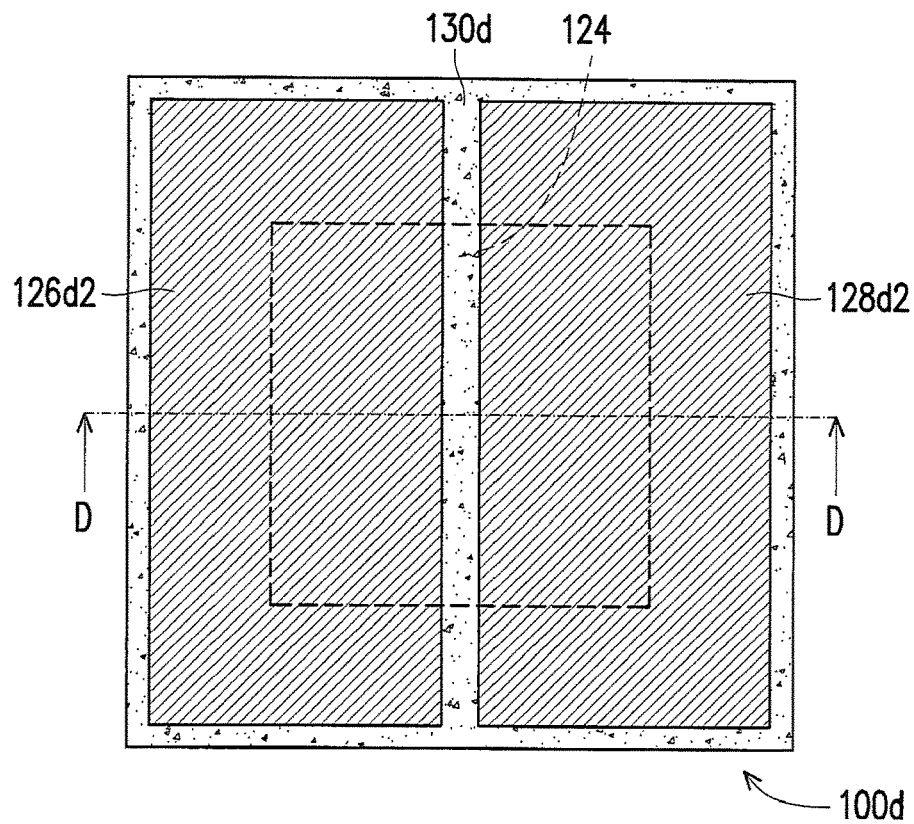
FIG. 4A is a top view of an LED package structure according to another embodiment of the invention.
Figure 4B:
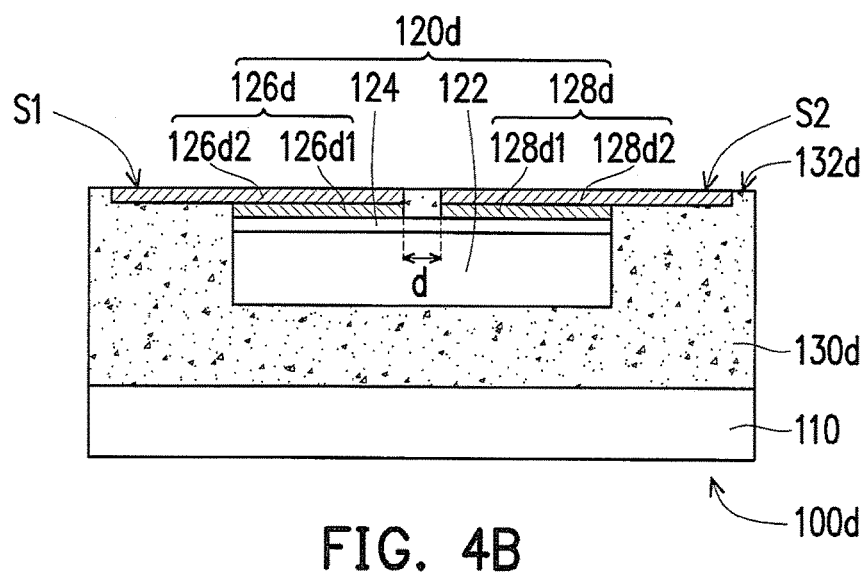
FIG. 4B is a cross-sectional view of the LED package structure of FIG. 4A viewing along a line D-D.

FIG. 4A is a top view of a light emitting device according to another embodiment of the invention. FIG. 4B is a cross-sectional view of the light emitting device of FIG. 4A viewing along a line D-D. Referring to FIG. 4A and FIG. 4B, the light emitting device 100d of the present embodiment is similar to the light emitting device 100a of FIG. 1A and FIG. 1B, and a main difference therebetween is that the encapsulant 130d of the present embodiment further wraps the first electrode 126d and the second electrode 128d and exposes the upper surfaces of the above electrodes, and the encapsulant 130d fills up the interval d between the first electrode 126d and the second electrode 128d, where a sidewall of the first electrode extending portion 126d2 and a sidewall of the second electrode extending portion 128d2 are also wrapped by the encapsulant 130d. Moreover, the edge of the first electrode extending portion 126d2 and the edge of the second electrode extending portion 128d2 are contracted relative to the edge of the encapsulant 130d and the edge of the light transmissive layer 110. A first upper surface Si of the first electrode extending portion 126d2 and a second upper surface S2 of the second electrode extending portion 128d2 are substantially coplanar with the upper surface 132d of the encapsulant 130d. Namely, the first electrode extending portion 126d2 is disposed on the first electrode portion 126d1, and the first upper surface S1 of the first electrode extending portion 126d2 is substantially coplanar with the upper surface 132d of the encapsulant 130d. The second electrode extending portion 128d2 is disposed on the second electrode portion 128d1, and the second upper surface S2 of the second electrode extending portion 128d2 is substantially coplanar with the upper surface 132d of the encapsulant 130d. In this way, when the light emitting device 100d is electrically connected to an external circuit (not shown), the design of the first electrode 126d and the second electrode 128d of the light emitting unit 120d results in a fact that the light emitting device 100d has no assembling gap in assembling, so as to effectively prevent moisture and oxygen from entering the light emitting device 100d.

Figure 5A:
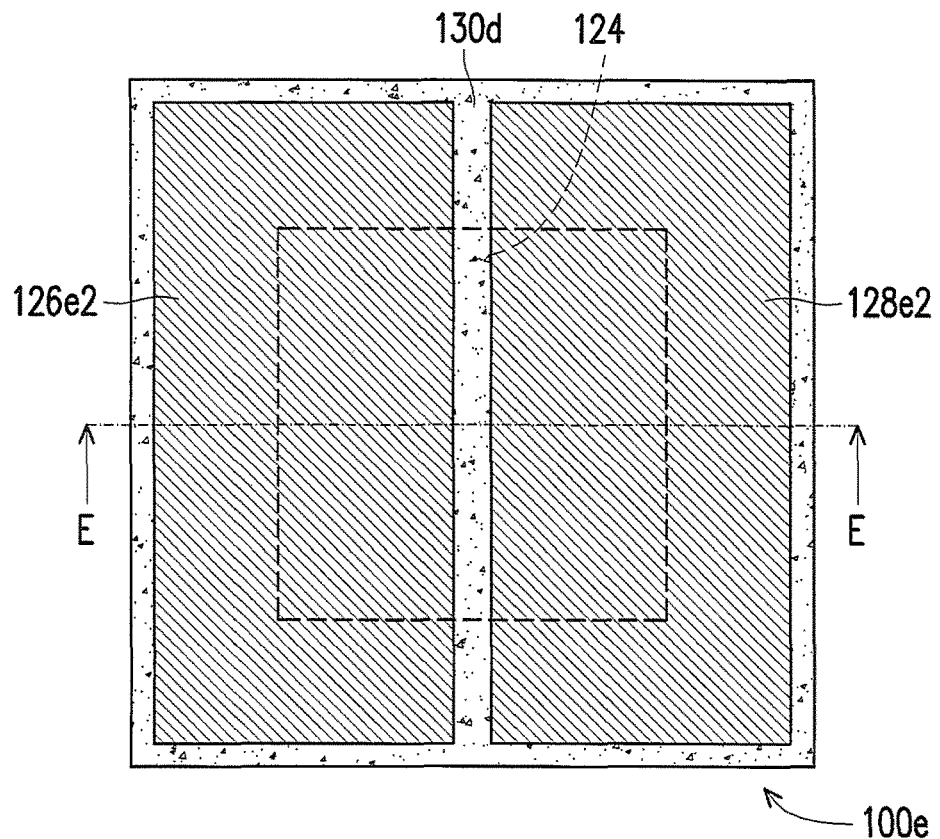
FIG. 5A is a top view of an LED package structure according to another embodiment of the invention.
Figure 5B:
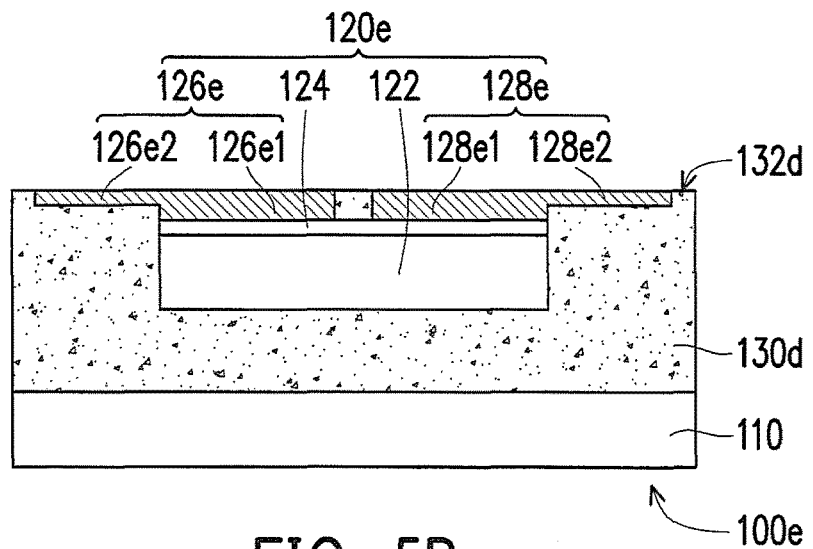
FIG. 5B is a cross-sectional view of the LED package structure of FIG. 5A viewing along a line E-E.

FIG. 5A is a top view of a light emitting device according to another embodiment of the invention. FIG. 5B is a cross-sectional view of the light emitting device of FIG. 5A viewing along a line E-E. Referring to FIG. 5A and FIG. 5B, the light emitting device 100e of the present embodiment is similar to the light emitting device 100d of FIG. 4A and FIG. 4B, and a main difference therebetween is that the first electrode extending portion 126e2 and the first electrode portion 126e1 of the present embodiment have a seamless connection therebetween, and the second electrode extending portion 128e2 and the second electrode portion 128e1 have a seamless connection therebetween. Namely, the first electrode extending portion 126e2 and the first electrode portion 126e1 of the first electrode 126e of the light emitting unit 120e are formed integrally, and the second electrode extending portion 128e2 and the second electrode portion 128e1 of the second electrode 128e are formed integrally, such that integrity of the light emitting device 100e is better so as to achieve better reliability.

Figure 6A:
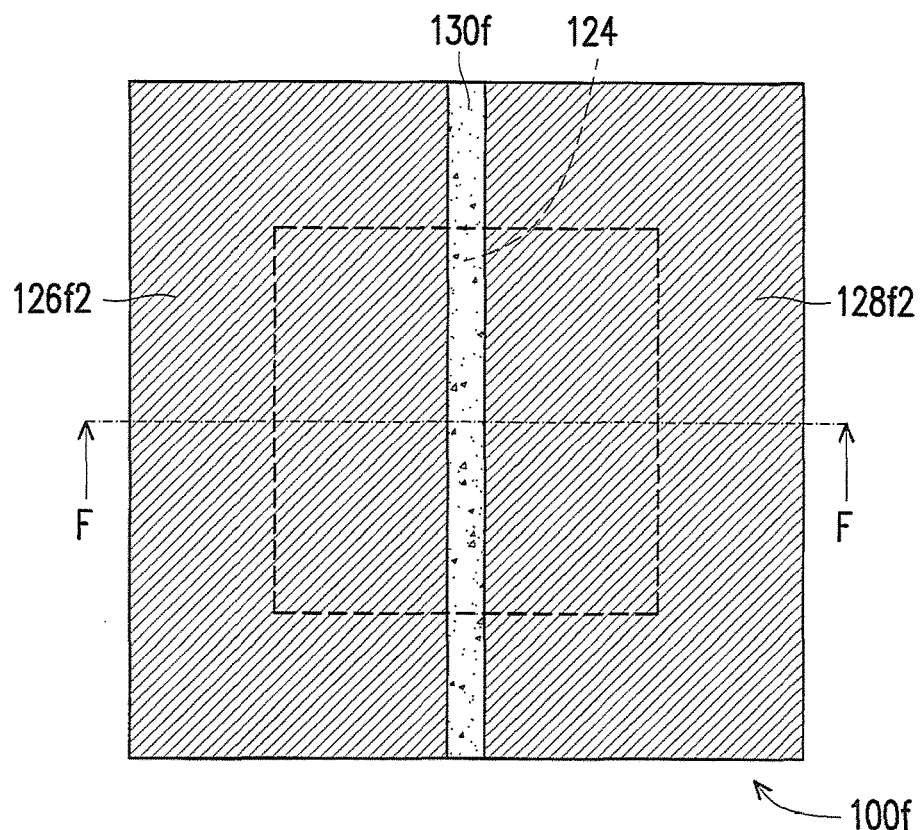
FIG. 6A is a top view of an LED package structure according to another embodiment of the invention.
Figure 6B:
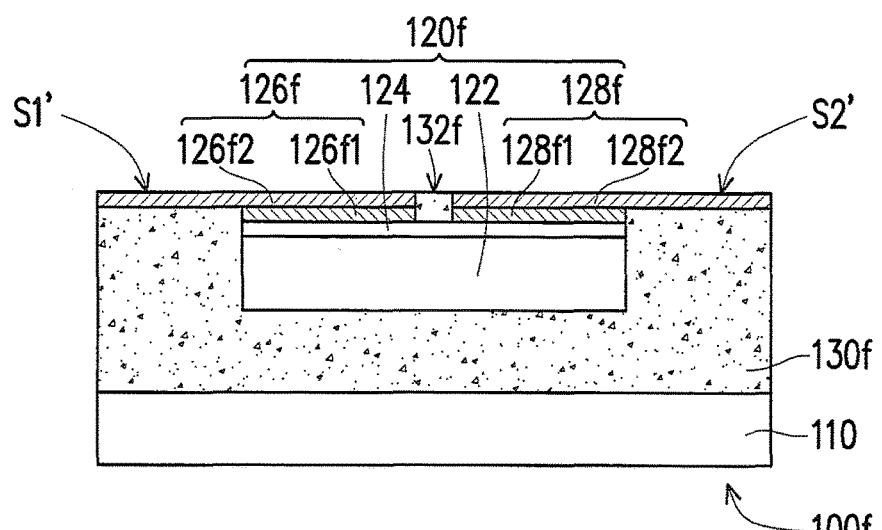
FIG. 6B is a cross-sectional view of the LED package structure of FIG. 6A viewing along a line F-F.

FIG. 6A is a top view of a light emitting device according to another embodiment of the invention. FIG. 6B is a cross-sectional view of the light emitting device of FIG. 6A viewing along a line F-F. Referring to FIG. 6A and FIG. 6B, the light emitting device 100f of the present embodiment is similar to the light emitting device 100d of FIG. 4A and FIG. 4B, and a main difference therebetween is that the edge of the first electrode extending portion 126f2 and the edge of the second electrode extending portion 128f2 are aligned with the edge of the encapsulant 130f and the edge of the light transmissive unit 110, and are not wrapped by the encapsulant 130f. Now, the first electrode extending portion 126f2 of the light emitting unit 120f is disposed on the first electrode portion 126f1, and the first upper surface SF of the first electrode extending portion 126f2 is substantially coplanar with the upper surface 132f of the encapsulant 130f. The second electrode extending portion 128f2 of the light emitting unit 120f is disposed on the second electrode portion 128f1, and the second upper surface ST of the second electrode extending portion 128f2 is substantially coplanar with the upper surface 132f of the encapsulant 130f.

Figure 7A:
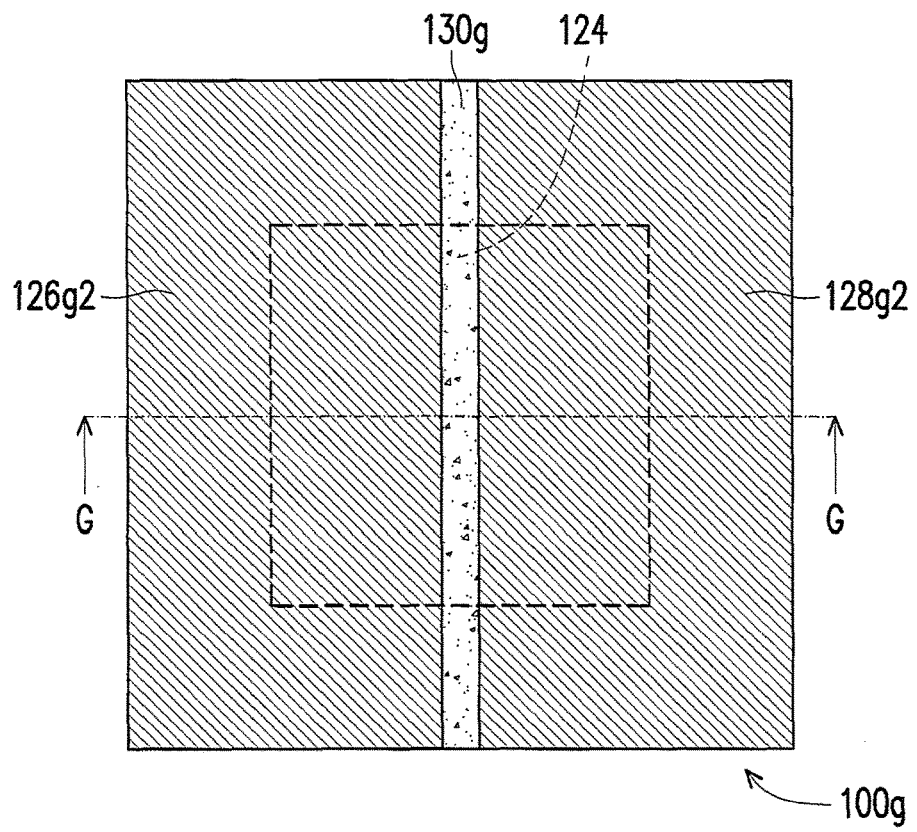
FIG. 7A is a top view of an LED package structure according to another embodiment of the invention.
Figure 7B:
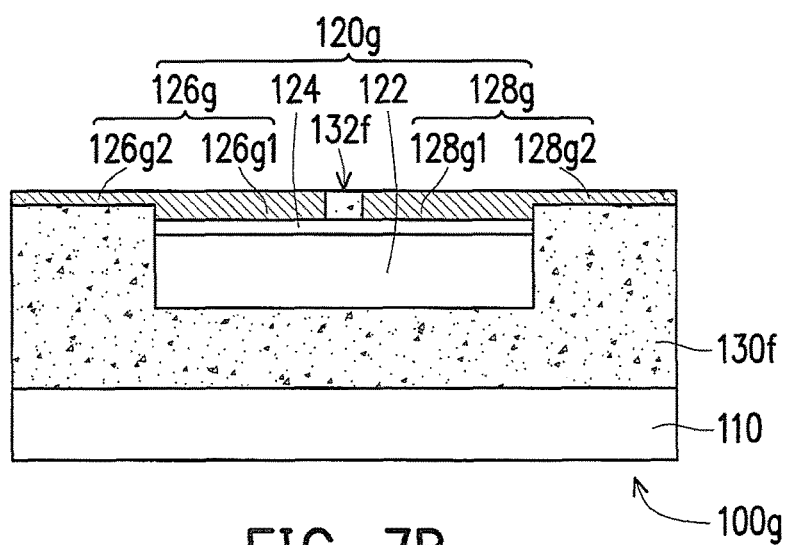
FIG. 7B is a cross-sectional view of the LED package structure of FIG. 7A viewing along a line G-G.

FIG. 7A is a top view of a light emitting device according to another embodiment of the invention. FIG. 7B is a cross-sectional view of the light emitting device of FIG. 7A viewing along a line G-G. Referring to FIG. 7A and FIG. 7B, the light emitting device 100g of the present embodiment is similar to the light emitting device 100f of FIG. 6A and FIG. 6B, and a main difference therebetween is that the first electrode extending portion 126g2 and the first electrode portion 126g1 of the present embodiment have a seamless connection therebetween, and the second electrode extending portion 128g2 and the second electrode portion 128g1 have a seamless connection therebetween. Namely, the first electrode extending portion 126g2 and the first electrode portion 126g1 of the first electrode 126g of the light emitting unit 120g are formed integrally, and the second electrode extending portion 128g2 and the second electrode portion 128g1 of the second electrode 128g are formed integrally.

Figure 8A:
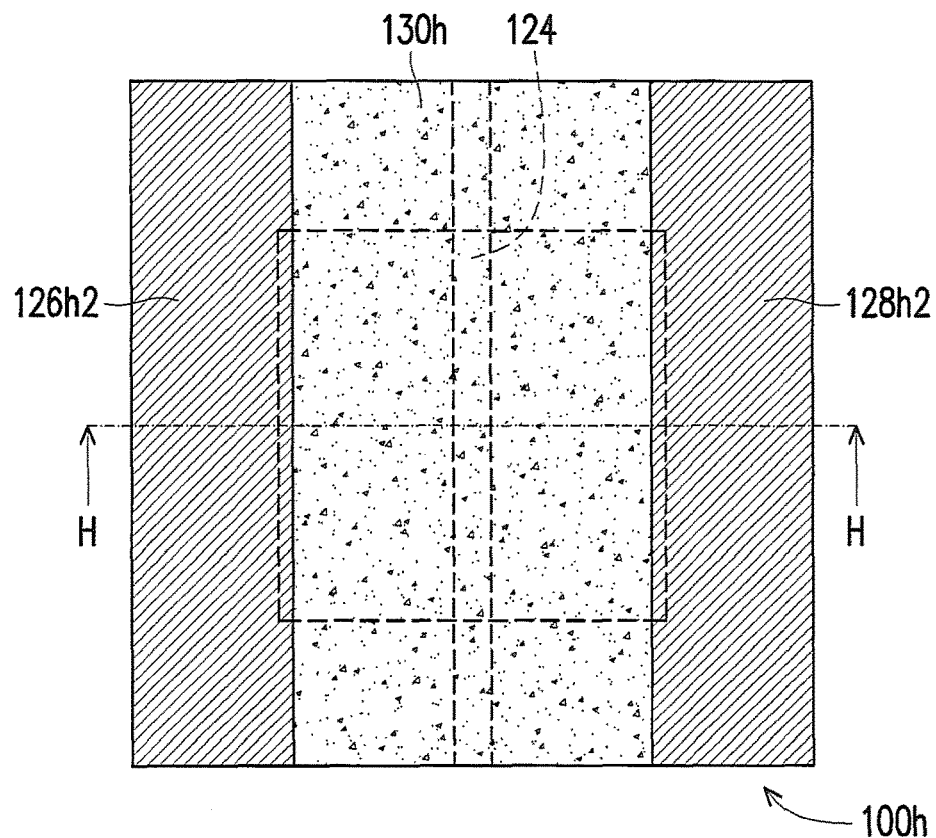
FIG. 8A is a top view of an LED package structure according to another embodiment of the invention.
Figure 8B:
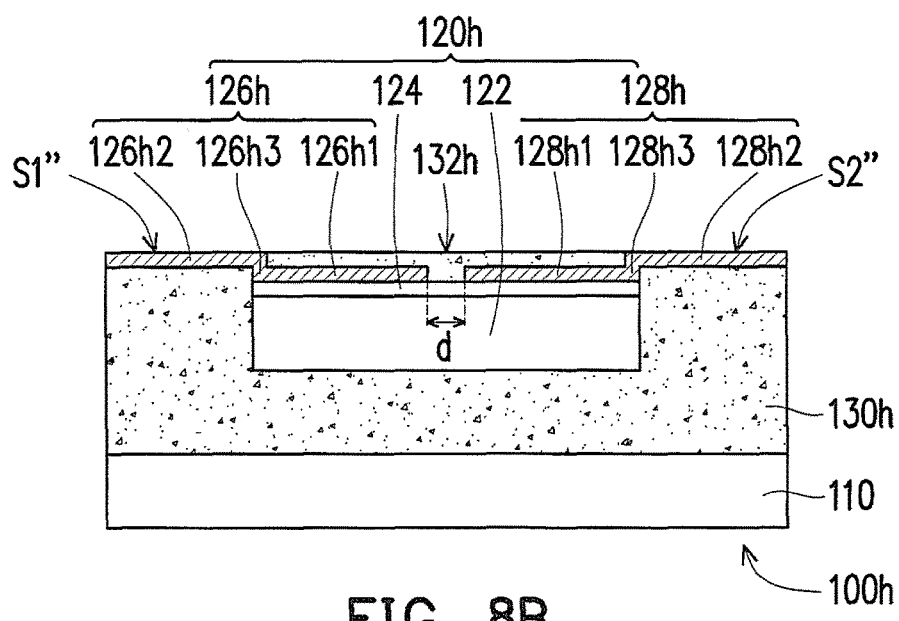
FIG. 8B is a cross-sectional view of the LED package structure of FIG. 8A viewing along a line H-H.

FIG. 8A is a top view of a light emitting device according to another embodiment of the invention. FIG. 8B is a cross-sectional view of the light emitting device of FIG. 8A viewing along a line H-H. Referring to FIG. 8A and FIG. 8B, the light emitting device 100h of the present embodiment is similar to the light emitting device 100g of FIG. 7A and FIG. 7B, and a main difference therebetween is that the first electrode 126h of the light emitting unit 120h of the present embodiment further includes a first connection portion 126h 3 connecting the first electrode portion 126h1 and the first electrode extending portion 126h2. An extending direction of the first connection portion 126h 3 is perpendicular to an extending direction of the first electrode portion 126h1 and an extending direction of the first electrode extending portion 126h2. The first electrode portion 126h1, the first connection portion 126h 3 and the first electrode extending portion 126h2 may have a seamless connection therebetween. The second electrode 128h of the light emitting unit 120h further includes a second connection portion 128h 3 connecting the second electrode portion 128h1 and the second electrode extending portion 128h2. An extending direction of the second connection portion 128h 3 is perpendicular to an extending direction of the second electrode portion 128h1 and an extending direction of the second electrode extending portion 128h2. The second electrode portion 128h1, the second connection portion 128h 3 and the second electrode extending portion 128h2 may have a seamless connection therebetween. The first upper surface S1" of the first electrode extending portion 126h2 and the second upper surface S2" of the second electrode extending portion 128h2 are substantially coplanar with the upper surface 132h of the encapsulant 130h. The encapsulant 130h fills up the interval d between the first electrode 126h and the second electrode 128h. The edge of the first electrode extending portion 126h2 and the edge of the second electrode extending portion 128h2 are aligned with the edge of the encapsulant 130h and the edge of the light transmissive layer 110.

Figure 9A:
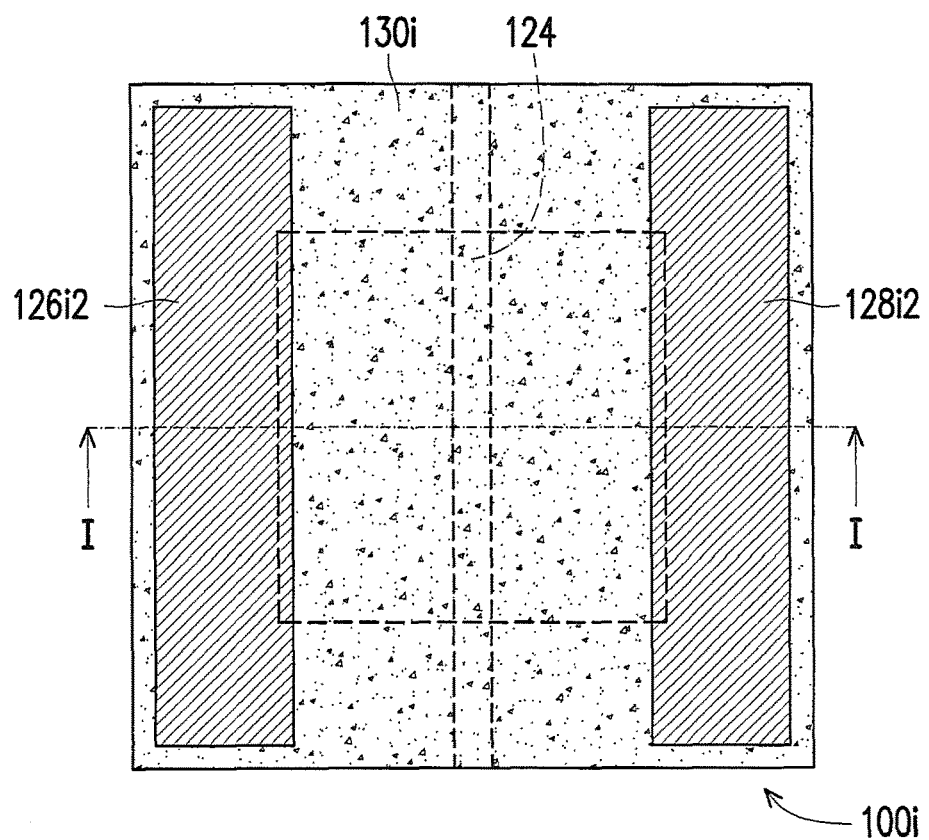
FIG. 9A is a top view of an LED package structure according to another embodiment of the invention.
Figure 9B:
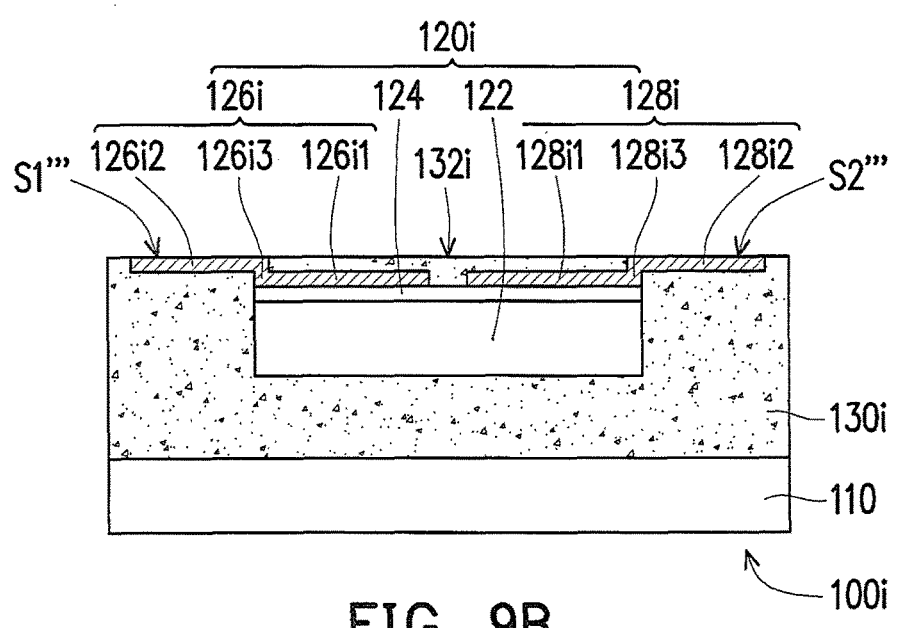
FIG. 9B is a cross-sectional view of the LED package structure of FIG. 9A viewing along a line I-I.
Figure 10A:
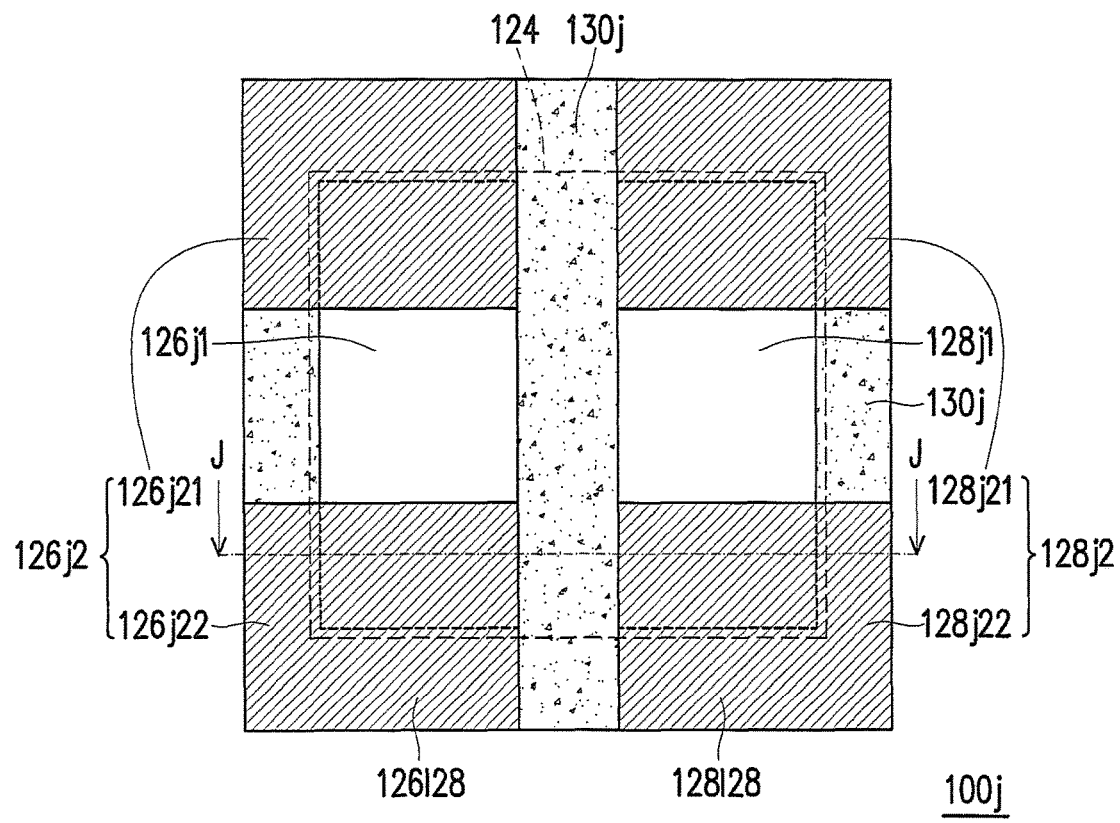
FIG. 10A is a top view of an LED package structure according to another embodiment of the invention.
Figure 10B:
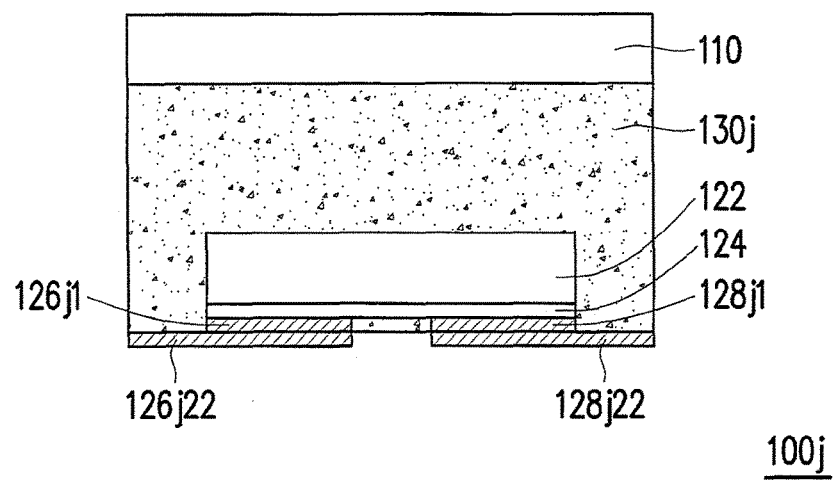
FIG. 10B is a cross-sectional view of the LED package structure of FIG. 10A viewing along a line J-J.

FIG. 9A is a top view of a light emitting device according to another embodiment of the invention. FIG. 9B is a cross-sectional view of the light emitting device of FIG. 9A viewing along a line I-I. Referring to FIG. 9A and FIG. 9B, the light emitting device 100i of the present embodiment is similar to the light emitting device 100h of FIG. 8A and FIG. 8B, and a main difference therebetween is that the sidewall of the first electrode extending portion 126i2 and the sidewall of the second electrode extending portion 128i2 are wrapped by the encapsulant 130i in this embodiment. Namely, the first electrode 126i, the second electrode 128i, the epitaxial structure layer 124 and the substrate 122 of the light emitting unit 120i are encapsulated by the encapsulant 130i, though the upper surfaces of the above electrodes are exposed. The first electrode extending portion 126i2 of the first electrode 126i is connected to the first electrode portion 126i1 through the first connection portion 126i 3, and the first surface S of the first electrode extending portion 126i2 is substantially coplanar with the upper surface 132i of the encapsulant 130i. Moreover, the second electrode extending portion 128i2 of the second electrode 128i is connected to the second electrode portion 128i1 through the second connection portion 128i 3, and the second surface S2''' of the second electrode extending portion 128i2 is substantially coplanar with the upper surface 132i of the encapsulant 130i FIG. 10A is a top view of a light emitting device (LED package) according to another embodiment of the invention. FIG. 10B is a cross-sectional view of the light emitting device of FIG. 10A viewing along a line J-J. Referring to FIG. 10A and FIG. 10B, the light emitting device (LED package) 100j of the present embodiment is similar to the light emitting device 100a of FIG. 1A, and differences therebetween are as follows. In the LED package 100j of the present embodiment, the first electrode extending portion 126j2 includes a plurality of first sub-electrodes 126j21, 126j22 separated from each other, and the second electrode extending portion 128j2 includes a plurality of second sub-electrodes 128j21, 128j22 separated from each other. In the present embodiment, the first sub-electrodes 126j21, 126j22 are located at two adjacent corners of the encapsulant, and the second sub-electrodes 128j21, 128j22 are located at the other two adjacent corners of the encapsulant. In other words, the first sub-electrodes 126j21, 126j22 extend from the edge of the first electrode portion 126j1 along a direction away from the second electrode portion 128j1, and the second sub-electrodes 128j21, 128j22 extend from the edge of the second electrode portion 128j1 along a direction away from the first electrode portion 126j1, so that the sub-electrodes 126j21, 126j22, 128j21, 128j22 respectively extend to four corners of the supper surface of the light emitting device 100j. Moreover, in the present embodiment, the encapsulant 130j encapsulates the first electrode portion 126j1 and the second electrode portion 128j1, and the sub-electrodes 126j21, 126j22, 128j21 and 128j22 extend to cover the encapsulant 130j. In the present embodiment, the LED package 100j may further include a light transmissive layer 110, and the encapsulant 130j is disposed on the light transmissive layer 110. Compared to FIG. 1B, FIG. 10B only illustrates a situation that the LED package 100j is turned off to facilitate flip-chip bonding.

In the LED package 100j of the present embodiment, since the sub-electrodes 126j21, 126j22, 128j21, 128j22 configured at the four corners of the upper surface of the LED package 100j can be respectively bonded to the circuit board through four solder pastes, and the four solder pastes configured at the four corners can disperse a stress in case of reflow. In this way, after the LED package 100j is bonded to the circuit board and cooled down, the LED package 100j is avoid to be shifted by an angle relative to a predetermined position, so as to ensure a yield of the bonding process.

Figure 11A:
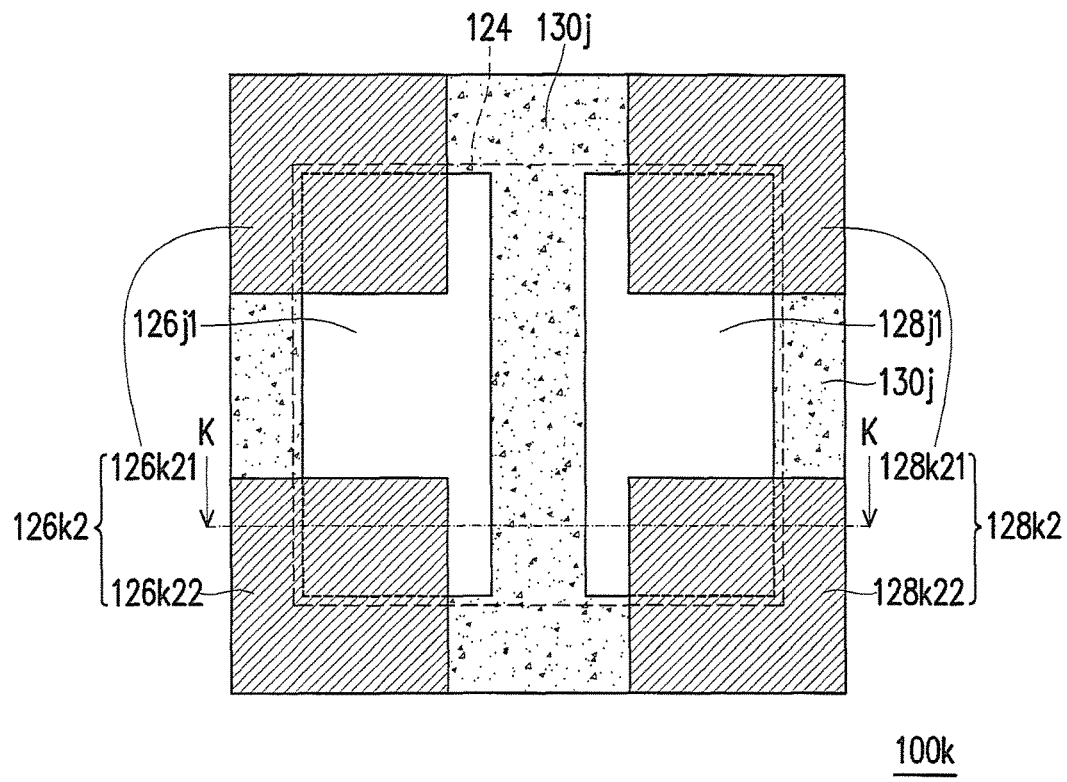
FIG. 11A is a top view of an LED package structure according to another embodiment of the invention.
Figure 11B:
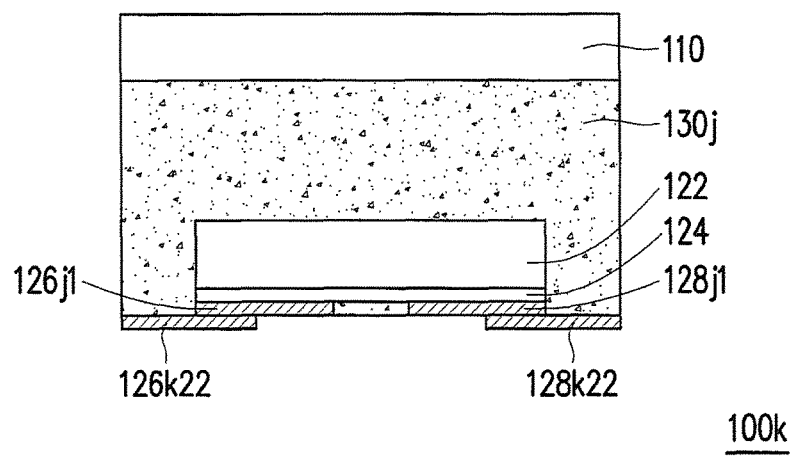
FIG. 11B is a cross-sectional view of the LED package structure of FIG. 11A viewing along a line K-K.

FIG. 11A is a top view of an LED package according to another embodiment of the invention. FIG. 11B is a cross-sectional view of the LED package of FIG. 11A viewing along a line K-K. Referring to FIG. 11A and FIG. 11B, the LED package 100k of the present embodiment is similar to the LED package 100j of FIG. 10A and FIG. 10B, and differences therebetween are as follows. In the LED package 100k of the present embodiment, the areas that the first sub-electrodes 126k21, 126k22 of the first electrode extending portion 126k2 respectively cover the first electrode portion 126k1 are relatively small, and the first sub-electrodes 126k21, 126k22 respectively cover two adjacent corners of the first electrode portion 126k1, where the two adjacent corners are respectively close to the two adjacent corners of the upper surface of the LED package 100k. Moreover, the areas that the second sub-electrodes 128k21, 128k22 of the second electrode extending portion 128k2 respectively cover the second electrode portion 128k1 are relatively small, and the second sub-electrodes 128k21, 128k22 respectively cover two adjacent corners of the second electrode portion 128k1, where the two adjacent corners are respectively close to the two adjacent corners of the upper surface of the LED package 100k.

Figure 12A:
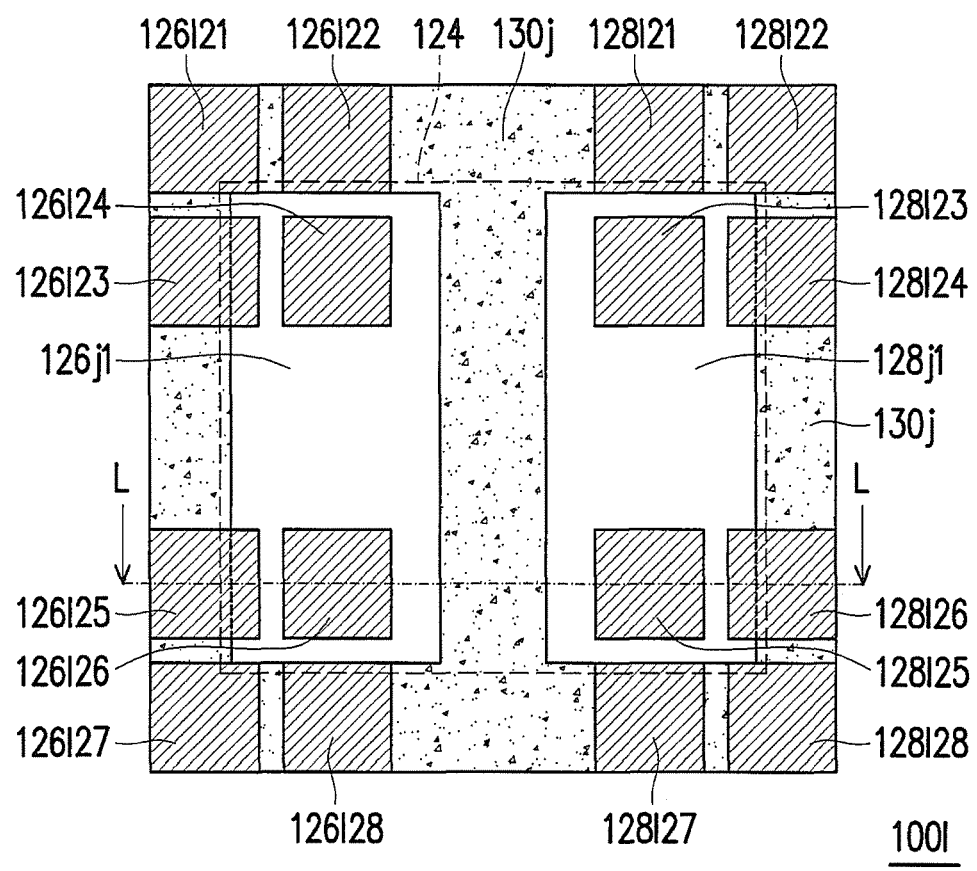
FIG. 12A is a top view of an LED package structure according to another embodiment of the invention.
Figure 12B:
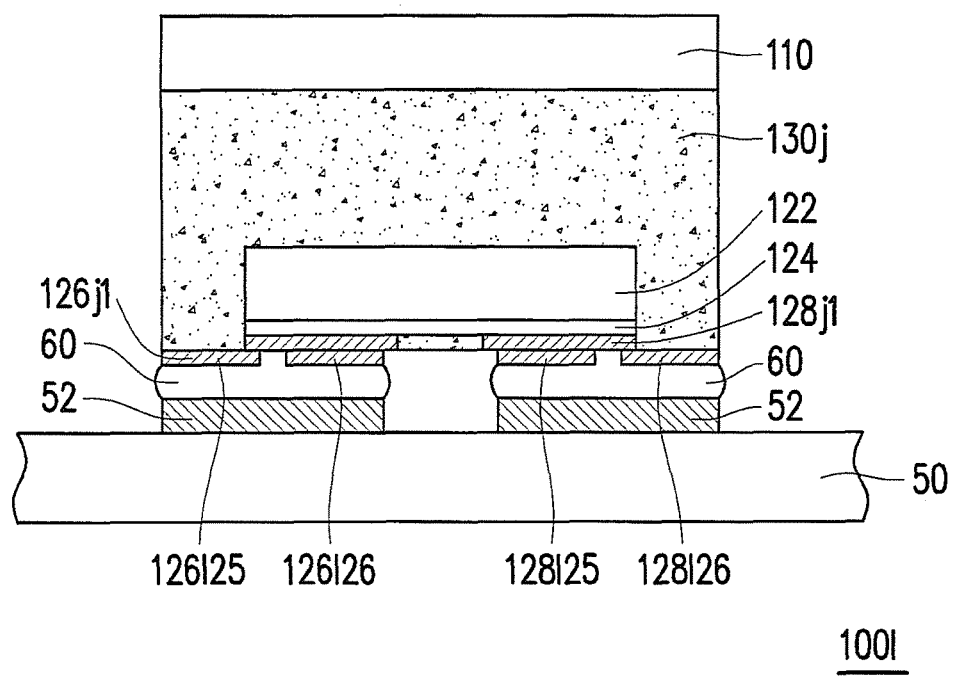
FIG. 12B is a cross-sectional view of the LED package structure of FIG. 12A bonded to a circuit board in a flip-chip manner and viewing along a line L-L.

FIG. 12A is a top view of an LED package according to another embodiment of the invention. FIG. 12B is a cross-sectional view of the LED package of FIG. 12A bonded to a circuit board in a flip-chip manner and viewing along a line L-L. Referring to FIG. 12A and FIG. 12B, the LED package 1001 of the present embodiment is similar to the LED package 100k of FIG. 11A and FIG. 11B, and differences therebetween are as follows. In the LED package 1001 of the present embodiment, the first sub-electrodes 126121-126128 of the first electrode extending portion 126I2 are grouped into two first sub-electrode groups 1261a and 1261b, where each of the first sub-electrode groups 1261a and 1261b respectively includes a part of the first sub-electrodes. For example, as shown in FIG. 12A, the first sub-electrode group 1261a includes four first sub-electrodes 126121-126124, and the first sub-electrode group 1261b includes four first sub-electrodes 126125-126128. Moreover, the second sub-electrodes 128121-128128 of the second electrode extending portion 128I2 are grouped into two second sub-electrode groups 1281a and 1281b, where each of the second sub-electrode groups 1281a and 1281b respectively includes a part of the second sub-electrodes. For example, as shown in FIG. 12A, the second sub-electrode group 1281a includes four second sub-electrodes 128121-128124, and the second sub-electrode group 1281b includes four second sub-electrodes 128125-128128. In the present embodiment, the two first sub-electrode groups 1261a and 1261b are respectively disposed at two adjacent corners on the upper surface of the LED package 1001, and the two second sub-electrode groups 1281a and 1281b are respectively disposed at the other two adjacent corners on the upper surface of the LED package 1001.

The light emitting device 1001 can be bonded to the circuit board 50 through the flip-chip bonding manner. For example, the two first sub-electrode groups 1261a, 1261b are respectively bonded to electrode pads 52 (for example, the electrode pads 52 located to the left as shown in FIG. 12B) on the circuit board 50 through two cured solder pastes 60, and the two second sub-electrode groups 1281a, 1281b are respectively bonded to electrode pads 52 (for example, the electrode pads 52 located to the right as shown in FIG. 12B) on the circuit board 50 through two cured solder pastes 60. Since the solder pastes 60 can be filled in an interval between two adjacent sub-electrodes before curing, a bonding force between the solder pastes 60 and the first sub-electrodes 126121-126128 and a bonding force between the solder pastes 60 and the second sub-electrodes 128121-128128 can be effectively enhanced, so as to improve reliability of the light emitting device 1001 bonded to the circuit board 50.

Figure 13:
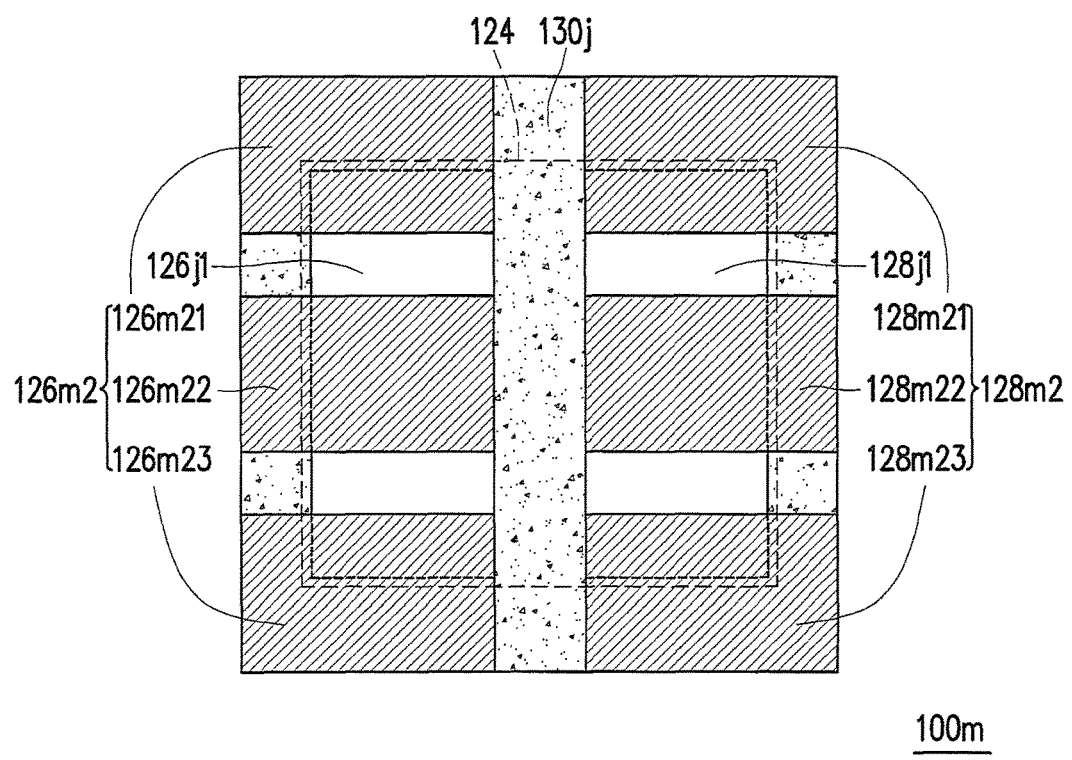
FIG. 13 is a top view of an LED package structure according to another embodiment of the invention.

FIG. 13 is a top view of a light emitting device according to another embodiment of the invention. Referring to FIG. 13, the light emitting device 100m of the present embodiment is similar to the light emitting device 100j of FIG. 10A, and differences therebetween are as follows. In the light emitting device 100m of the present embodiment, the first sub-electrodes 126m21, 126m23 of the first electrode extending portion 126m2 are respectively disposed at two adjacent corners on the upper surface of the light emitting device 100m, and the first sub-electrode 126m22 is disposed between the first sub-electrode 126m21 and the first sub-electrode 126m23. Moreover, the second sub-electrodes 128m21, 128m23 of the second electrode extending portion 128m2 are respectively disposed at another two adjacent corners on the upper surface of the light emitting device 100m, and the second sub-electrode 128m22 is disposed between the second sub-electrode 128m21 and the second sub-electrode 128m23.

In other embodiments of the invention, the number and configuration of the first sub-electrodes and the second sub-electrodes can be modified, which is not limited by the invention.

Figure 14:
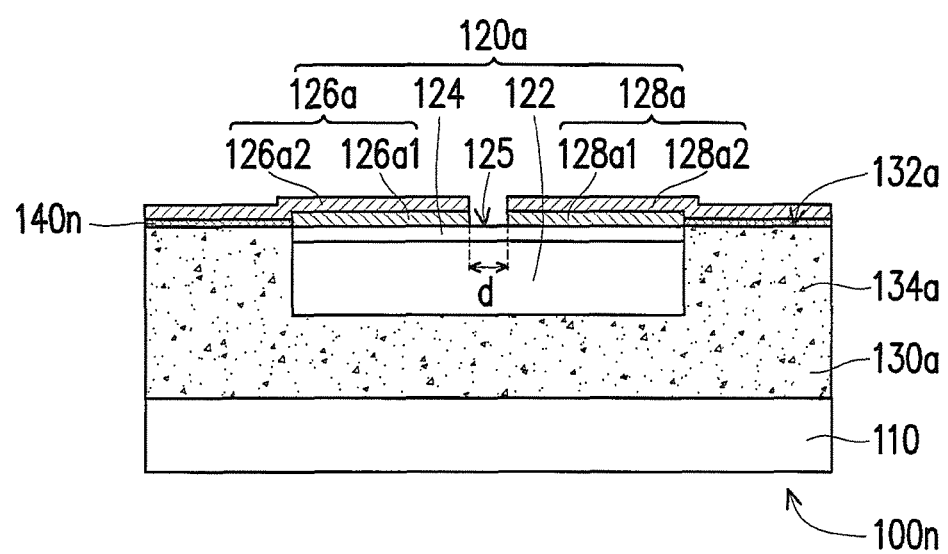
FIG. 14 is a cross-sectional view of an LED package structure according to another embodiment of the invention.

FIG. 14 is a cross-sectional view of a light emitting device according to another embodiment of the invention. Referring to FIG. 14, the light emitting device 100n of the present embodiment is similar to the light emitting device 100a of FIG. 1B, and differences therebetween are as follows. In the present embodiment, the light emitting device 100n further includes a reflection layer 140n, which is at least disposed on the upper surface 132a of the encapsulant 130a. In the present embodiment, at least a part of the reflection layer 140n is disposed between the first electrode 126a and the upper surface 132a of the encapsulant 130a, and between the second electrode 128a and the upper surface 132a of the encapsulant 130a. To be specific, the reflection layer 140n can be disposed between the first electrode extending portion 126a2 and the upper surface 132a of the encapsulant 130a and between the second electrode extending portion 128a2 and the upper surface 132a of the encapsulant 130a. The reflection layer 140a is, for example, gold, aluminium, silver, nickel, titanium, distributed Bragg reflector (DBR), a resin layer doped with reflection particles with high reflectivity (for example, a silicone layer or an epoxy resin layer) or a combination thereof. The reflection layer 140n can reflect the light emitted by the light emitting unit 120a to the light transmissive layer 110, such that the light can effectively emit out from the light transmissive layer 110. When the reflection layer 140n is made of an insulation material, the reflection layer 140n can be connected in a whole piece to cover the entire upper surface 132a of the encapsulant 130a. However, when the reflection layer 140n is made of a conductive material or a metal material, the part of the reflection layer 140n disposed under the first electrode extending portion 126a2 has to be separated from the part of the reflection layer 140n disposed under the second electrode extending portion 128a2 to avoid short circuit.

Figure 15A:
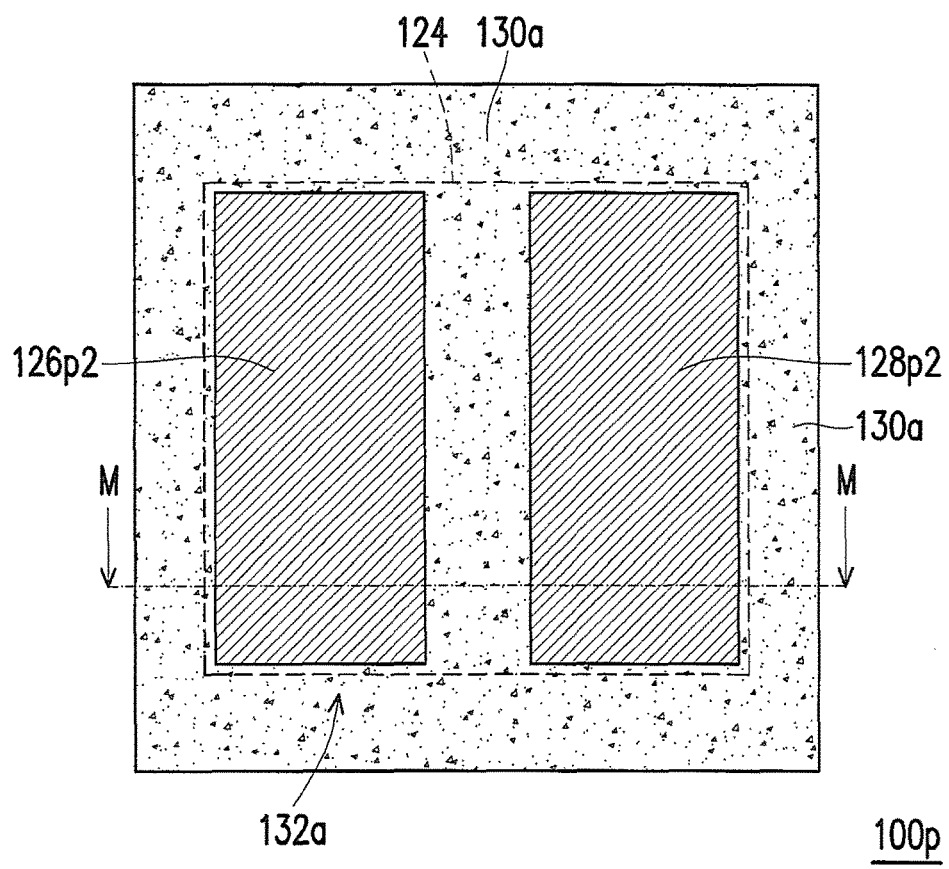
FIG. 15A is a top view of an LED package structure according to another embodiment of the invention.
Figure 15B:
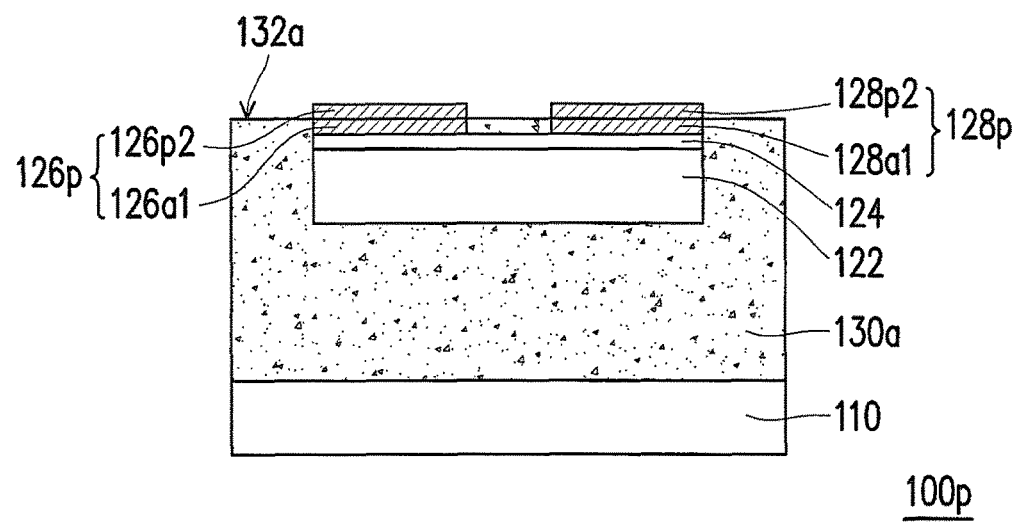
FIG. 15B is a cross-sectional view of the LED package structure of FIG. 15A viewing along a line M-M.

FIG. 15A is a top view of a light emitting device according to another embodiment of the invention. FIG. 15B is a cross-sectional view of the light emitting device of FIG. 15A viewing along a line M-M. Referring to FIG. 15A and FIG. 15B, the light emitting device 100p of the present embodiment is similar to the light emitting device 100f of FIG. 6A and FIG. 6B, and differences therebetween are as follows. In the light emitting device 100p of the present embodiment, the first electrode 126p and the second electrode 128p extend upward from the epitaxial structure layer 124 to protrude out from the upper surface 132a of the encapsulant 130a. In the present embodiment, neither the first electrode 126p nor the second electrode 128p covers the upper surface 132a of the encapsulant 130a.

To be specific, the first electrode extending portion 126p2 of the first electrode 126p is disposed on the first electrode portion 126a1 and protrudes out from the upper surface 132a of the encapsulant 130a, and the second electrode extending portion 128p2 of the second electrode 128p is disposed on the second electrode portion 128a1 and protrudes out from the upper surface 132a of the encapsulant 130a. In the present embodiment, neither the first electrode extending portion 126p2 nor the second electrode extending portion 128p2 covers the upper surface 132a of the encapsulant 130a, and the first electrode extending portion 126p2 and the second electrode extending portion 128p2 are substantially coplanar. In another embodiment, the first electrode 126p and the second electrode 128p can also extend upward from the epitaxial structure layer 124 without protruding out from the upper surface 132a of the encapsulant 130a. For example, the upper surface of the first electrode extending portion 126p2 (i.e. the surface facing away from the epitaxial structure layer 124), the upper surface of the second electrode extending portion 128p2 (i.e. the surface facing away from the epitaxial structure layer 124) and the upper surface 132a of the encapsulant 130a are substantially coplanar.

In the present embodiment, by increasing heights of the first electrode 126p and the second electrode 128p through the first electrode extending portion 126p2 and the second electrode extending portion 128p2, it avails a follow-up chip bonding process.

Figure 16A:
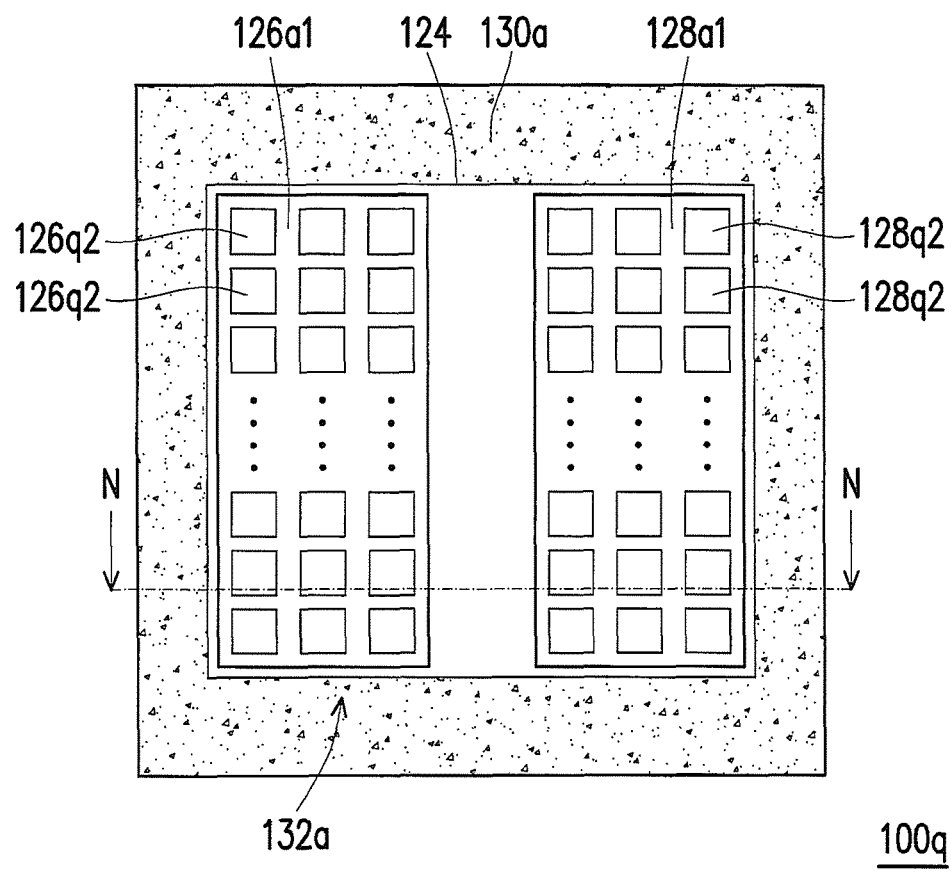
FIG. 16A is a top view of an LED package structure according to another embodiment of the invention.
Figure 16B:
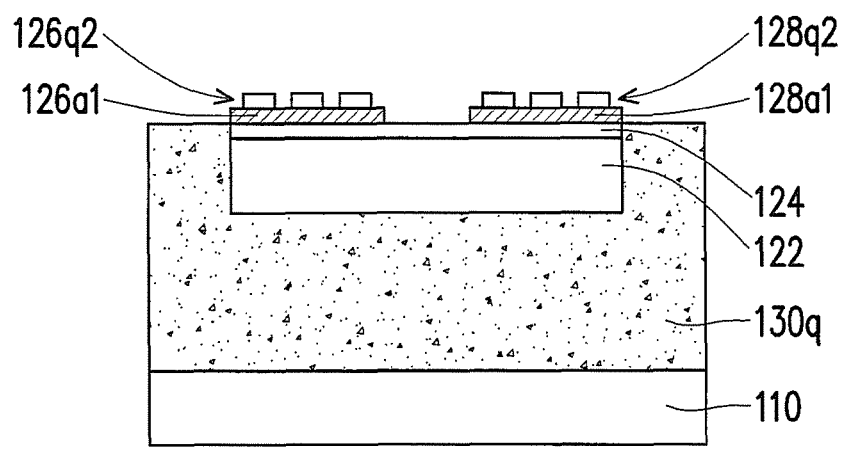
FIG. 16B is a cross-sectional view of the LED package structure of FIG. 16A viewing along a line N-N.

FIG. 16A is a top view of a light emitting device according to another embodiment of the invention. FIG. 16B is a cross-sectional view of the light emitting device viewing along a line N-N of FIG. 16A. Referring to FIG. 16A and FIG. 16B, the light emitting device 100q of the present embodiment is similar to the light emitting device 100p of FIG. 15A and FIG. 15B, and differences therebetween are as follows. In the light emitting device 100q of the present embodiment, the first electrode extending portion extending upward includes a plurality of first sub-electrodes 126q2 separated from each other, and the second electrode extending portion extending upward includes a plurality of second sub-electrodes 128q2 separated from each other.

Figure 17A:
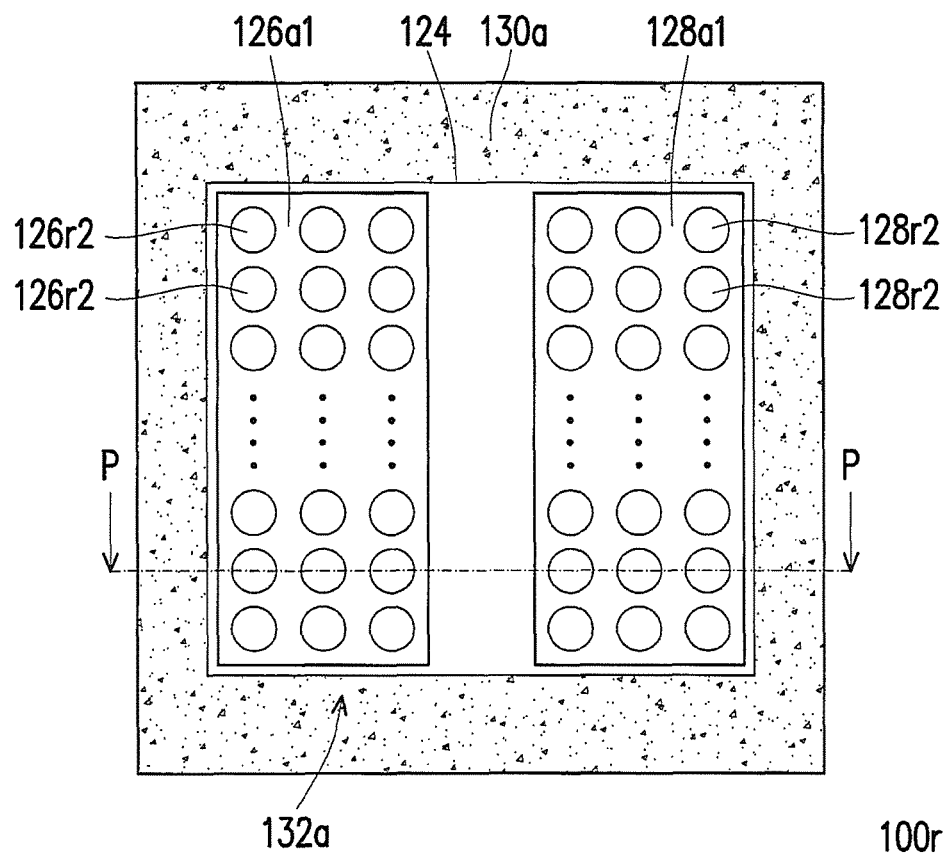
FIG. 17A is a top view of an LED package structure according to another embodiment of the invention.
Figure 17B:
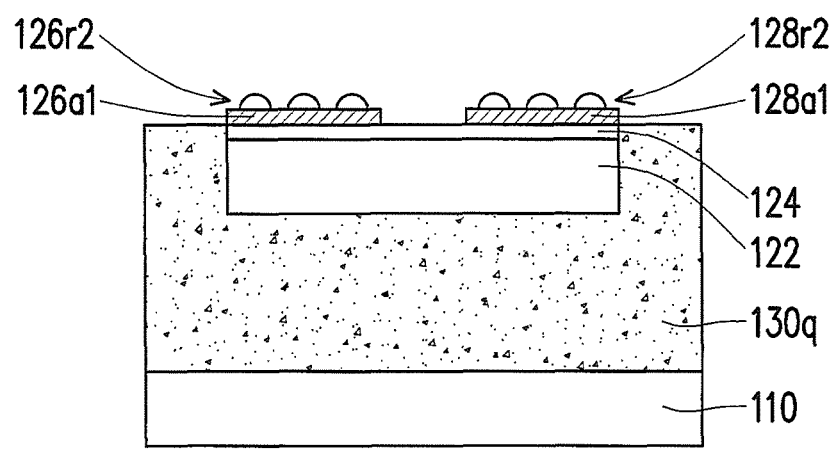
FIG. 17B is a cross-sectional view of the LED package structure of FIG. 17A viewing along a line P-P.

FIG. 17A is a top view of a light emitting device according to another embodiment of the invention. FIG. 17B is a cross-sectional view of the light emitting device of FIG. 17A viewing along a line P-P. Referring to FIG. 17A and FIG. 17B, the light emitting device 100r of the present embodiment is similar to the light emitting device 100q of FIG. 16A and FIG. 16B, and a main difference therebetween is that the first sub-electrodes 126q2 and the second sub-electrodes 128q2 of the light emitting device 100q are laminar electrodes, and the first sub-electrodes 126r2 and the second sub-electrodes 128r2 of the light emitting device 100r of the present embodiment are spherical electrodes, which can be formed according to a ball planting technique.

Figure 18A:
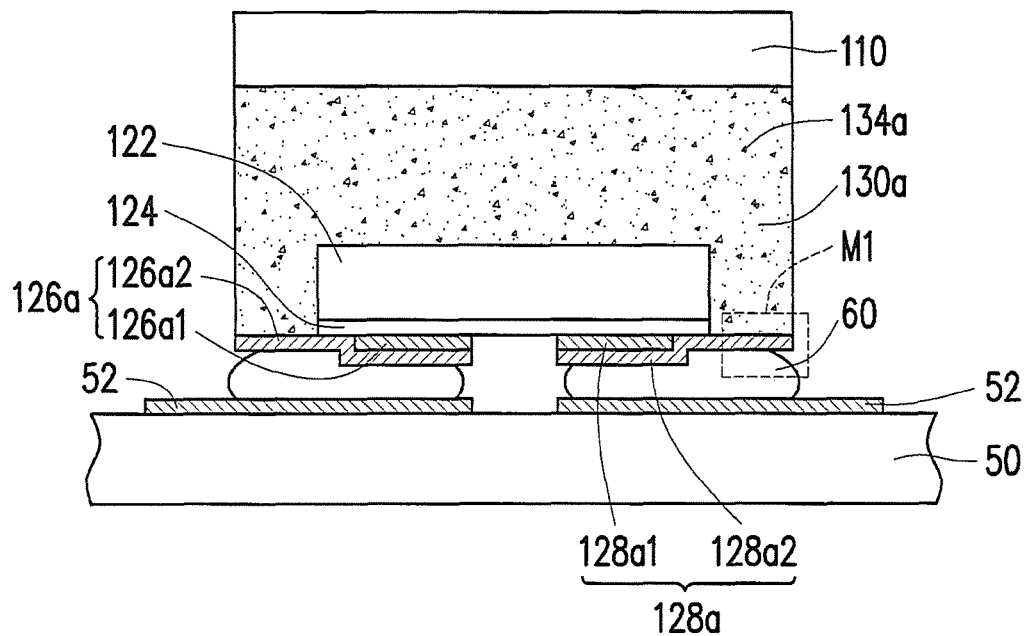
FIG. 18A is a cross-sectional view of an LED package structure of FIG. 1B bonded to a circuit board through a flip-chip bonding manner.
Figure 18B:
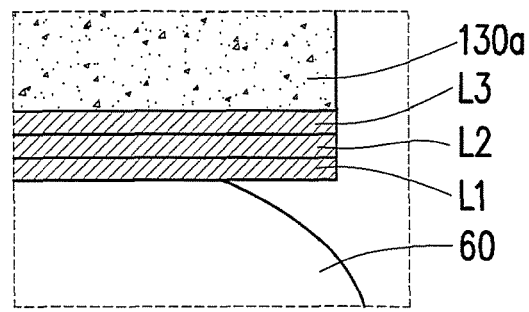
FIG. 18B is a partial enlarged view of a region Ml in FIG. 18A.

FIG. 18A is a cross-sectional view of a light emitting device of FIG. 1B bonded to a circuit board through a flip-chip bonding manner. FIG. 18B is a partial enlarged view of a region M1 in FIG. 18A. Referring to FIG. 18A and FIG. 18B, the light emitting device 100a can be bonded to the circuit board 50 through the flip-chip bonding manner. For example, the first electrode extending portion 126a2 and the second electrode extending portion 128a2 are respectively bonded to the two electrode pads 52 on the circuit board 50 through two cured solder pastes 60.

In the present embodiment, the first electrode extending portion 126a2 and the second electrode extending portion 128a2 respectively include an adhesion layer L1 and a barrier layer L2 disposed between the adhesion layer L1 and the encapsulant 130a. A material of the adhesion layer L1 includes gold, tin, aluminium, silver, copper, indium, bismuth, platinum, gold-tin alloy, tin-silver alloy, tin-silver-copper alloy (Sn—Ag—Cu (SAC) alloy) or a combination thereof, and a material of the barrier layer L2 includes nickel, titanium, tungsten, gold or an alloy of a combination thereof. The adhesion layer Ll is easy to be bonded with the solder pastes 60, and the barrier layer L2 can effectively prevent the material of the solder pastes 60 from invading the encapsulant 130a to contaminate the light emitting device 100a during the bonding process.

In the present embodiment, the first electrode extending portion 126a2 and the second electrode extending portion 128a2 further respectively include a reflection layer L3, which is at least disposed between the barrier layer L2 and the encapsulant 130a. The reflection layer L3 can reflect the light coming from the epitaxial structure layer 124 to improve a light usage rate. In the present embodiment, a material of the reflection layer L3 includes gold, aluminium, silver, nickel, titanium or an alloy of a combination thereof.

In summary, the first electrode and the second electrode of the light emitting unit according to the embodiment of the invention extend outward from the epitaxial structure layer to cover the encapsulant, namely, the light emitting device of the invention has a larger electrode area, so that when the light emitting device is to be assembled to an external circuit, the alignment accuracy of assembling is effectively improved. Since the first electrode and the second electrode of the light emitting unit according to the embodiment of the invention extend upward from the epitaxial structure layer, and protrude out of the encapsulant, it avails a follow-up chip bonding process.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A light emitting device, comprising:
 a light emitting unit, comprising:
  a substrate,
  an epitaxial structure layer, disposed on the substrate; and
  a first electrode and a second electrode, respectively disposed on a same side of the epitaxial structure layer opposite to the substrate;
 a light transmissive layer, disposed on the light emitting unit and located at one side of the substrate opposite to the epitaxial structure layer, the first electrode and the second electrode; and
 an encapsulant, located between the light emitting unit and the light transmissive layer, and encapsulating the light emitting unit and at least exposing a part of the first electrode and a part of the second electrode, wherein the first electrode and the second electrode extend outwardly to cover at least a part of an upper surface of the encapsulant respectively;
 wherein the first electrode and the second electrode are configured to be bonded to a first and a second electrode pads of an external circuit through a bonding material, the first electrode comprises a first electrode portion connected to the epitaxial structure layer and a first electrode extending portion connected to the first electrode portion, the second electrode comprises a second electrode portion connected to the epitaxial structure layer and a second electrode extending portion connected to the second electrode portion, and the first electrode extending portion and the second electrode extending portion respectively extend outward to at least a part of the upper surface of the encapsulant,
 wherein the first electrode extending portion comprises a plurality of first sub-electrodes separated from each other, the second electrode extending portion comprises a plurality of second sub-electrodes separated from each other, and two cured solder pastes are respectively filled in an interval between two adjacent first sub-electrodes and an interval between two adjacent second sub-electrodes.

2. The light emitting device as claimed in claim 1, further comprising:
one or more flat surfaces each comprising the light transmissive layer and the encapsulant.

3. The light emitting device as claimed in claim 1, wherein the first electrode extending portion and the second electrode extending portion are aligned with or contracted inward relative to an edge of the upper surface of the encapsulant.

4. The light emitting device as claimed in claim 1, wherein the first sub-electrodes of the first electrode extending portion are grouped into two first sub-electrode groups, where each of the first sub-electrode groups respectively includes a part of the first sub-electrodes, and the second sub-electrodes of the second electrode extending portion are grouped into two second sub-electrode groups, where each of the second sub-electrode groups respectively includes a part of the second sub-electrodes.

5. The light emitting device as claimed in claim 4, wherein the two first sub-electrode groups are respectively disposed at two adjacent corners on the upper surface of the encapsulant, and the two second sub-electrode groups are respectively disposed at another two adjacent corners on the upper surface of the encapsulant.

6. The light emitting device as claimed in claim 1, further comprising:
a wavelength conversion material mixed in the encapsulant.

7. A light emitting device, comprising:
a light emitting unit, comprising:
a substrate,
an epitaxial structure layer, disposed on the substrate; and
a first electrode and a second electrode, respectively disposed on a same side of the epitaxial structure layer; and
an encapsulant, encapsulating the light emitting unit and at least exposing a part of the first electrode and a part of the second electrode, wherein the first electrode and the second electrode respectively extend upward from the epitaxial structure layer;
wherein the first electrode and the second electrode are configured to be bonded to a first and a second electrode pads of an external circuit through a bonding material, the first electrode comprises a first electrode portion and a first electrode extending portion, and the second electrode comprises a second electrode portion and a second electrode extending portion, wherein the first electrode extending portion and the second electrode extending portion are coplanar, and the first electrode extending portion and the second electrode extending portion respectively protrude out from the upper surface of the encapsulant,
wherein the first electrode extending portion comprises a plurality of first sub-electrodes separated from each other, the second electrode extending portion comprises a plurality of second sub-electrodes separated from each other, and two cured solder pastes are respectively filled in an interval between two adjacent first sub-electrodes and an interval between two adjacent second sub-electrodes.

8. The light emitting device as claimed in claim 7 wherein the encapsulant has one or more flat surfaces.

9. The light emitting device as claimed in claim 7, wherein the first sub-electrodes of the first electrode extending portion are grouped into two first sub-electrode groups, where each of the first sub-electrode groups respectively includes a part of the first sub-electrodes, and the second sub-electrodes of the second electrode extending portion are grouped into two second sub-electrode groups, where each of the second sub-electrode groups respectively includes a part of the second sub-electrodes.

10. The light emitting device as claimed in claim 9, wherein the two first sub-electrode groups are respectively disposed at two adjacent corners on the upper surface of the encapsulant, and the two second sub-electrode groups are respectively disposed at another two adjacent corners on the upper surface of the encapsulant.

11. The light emitting device as claimed in claim 7, further comprising:
a wavelength conversion material mixed in the encapsulant.

12. A light emitting device, comprising:
a light emitting unit, comprising:
a substrate;
an epitaxial structure layer, disposed on the substrate; and
a first electrode and a second electrode, respectively disposed on a same side of the epitaxial structure layer;
a light transmissive layer, wherein the light emitting unit is disposed on the light transmissive layer and at least exposes the first electrode and the second electrode; and
an encapsulant, encapsulating the light emitting unit and at least exposing a part of the first electrode and a part of the second electrode, wherein the first electrode and the second electrode respectively extend upward from the epitaxial structure layer;
wherein the first electrode and the second electrode are configured to be bonded to a first and a second electrode pads of an external circuit through a bonding material, the first electrode comprises a first electrode portion and a first electrode extending portion, and the second electrode comprises a second electrode portion and a second electrode extending portion, wherein the first electrode portion and the second electrode portion are coplanar, and the first electrode extending portion and the second electrode extending portion respectively protrude out from the upper surface of the encapsulant,
wherein the first electrode extending portion comprises a plurality of first sub-electrodes separated from each other, the second electrode extending portion comprises a plurality of second sub-electrodes separated from each other, and two cured solder pastes are respectively filled in an interval between two adjacent first sub-electrodes and an interval between two adjacent second sub-electrodes.

13. The light emitting device as claimed in claim 12, further comprising:
one or more flat surfaces each comprising the light transmissive layer and the encapsulant.

14. The light emitting device as claimed in claim 12, wherein the first electrode extending portion and the second electrode extending portion are aligned with or contracted inward relative to an edge of the upper surface of the encapsulant.

* * * * *